(12) United States Patent
Kim et al.

(10) Patent No.: US 11,967,623 B2
(45) Date of Patent: Apr. 23, 2024

(54) SEMICONDUCTOR DEVICES AND ELECTRONIC SYSTEMS INCLUDING THE SAME

(71) Applicant: Samsung Electronics Co., Ltd., Suwon-si (KR)

(72) Inventors: Sunggil Kim, Yongin-si (KR); Jung-Hwan Kim, Seoul (KR); Gukhyon Yon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 343 days.

(21) Appl. No.: 17/388,233

(22) Filed: Jul. 29, 2021

(65) Prior Publication Data

US 2022/0181458 A1  Jun. 9, 2022

(30) Foreign Application Priority Data

Dec. 3, 2020  (KR) .................. 10-2020-0167790

(51) Int. Cl.
*H01L 29/423* (2006.01)
*H01L 23/00* (2006.01)
(Continued)

(52) U.S. Cl.
CPC ...... *H01L 29/42344* (2013.01); *H01L 23/481* (2013.01); *H01L 23/49816* (2013.01);
(Continued)

(58) Field of Classification Search
CPC ............. H01L 29/42344; H01L 23/481; H01L 23/49816; H01L 23/49822; H01L 23/49833; H01L 23/49838; H01L 23/5385; H01L 23/5386; H01L 24/08; H01L 24/32; H01L 25/0652; H01L 25/0657; H01L 29/42328; H01L 2224/08146; H01L 2224/32145; H01L 2224/32225; H01L 2225/0651; H01L 2225/06524; H01L 2225/06541; H01L 2225/06548;
(Continued)

(56) References Cited

U.S. PATENT DOCUMENTS 8,497,142 B2   7/2013   Yang et al.
8,658,499 B2   2/2014   Makala et al.
(Continued)

*Primary Examiner* — Benjamin Tzu-Hung Liu
(74) *Attorney, Agent, or Firm* — Myers Bigel, P.A.

(57) ABSTRACT

Disclosed is a semiconductor device comprising gate stack structures on a substrate, separation structures extending in a first direction on the substrate and separating the gate stack structures, and vertical structures penetrating the gate stack structures. Each gate stack structure includes cell dielectric layers and electrodes including upper electrodes, a barrier layer extending between the electrodes and the cell dielectric layers, a separation dielectric pattern extending in the first direction and penetrating the upper electrodes to separate each upper electrode into pieces that are spaced apart from each other in a second direction intersecting the first direction, and capping patterns between the separation dielectric pattern and the upper electrodes. The capping patterns are on sidewalls of each upper electrode and spaced apart from each other in a third direction perpendicular to a top surface of the substrate. Each capping pattern is on a sidewall of the barrier layer.

20 Claims, 16 Drawing Sheets

(51) Int. Cl.
*H01L 23/48* (2006.01)
*H01L 23/498* (2006.01)
*H01L 23/538* (2006.01)
*H01L 25/065* (2023.01)
*H10B 41/10* (2023.01)
*H10B 41/27* (2023.01)
*H10B 41/35* (2023.01)
*H10B 41/40* (2023.01)
*H10B 43/10* (2023.01)
*H10B 43/27* (2023.01)
*H10B 43/35* (2023.01)
*H10B 43/40* (2023.01)

(52) U.S. Cl.
CPC .. *H01L 23/49822* (2013.01); *H01L 23/49833* (2013.01); *H01L 23/49838* (2013.01); *H01L 23/5385* (2013.01); *H01L 23/5386* (2013.01); *H01L 24/08* (2013.01); *H01L 24/32* (2013.01); *H01L 25/0652* (2013.01); *H01L 25/0657* (2013.01); *H01L 29/42328* (2013.01); *H01L 2224/08146* (2013.01); *H01L 2224/32145* (2013.01); *H01L 2224/32225* (2013.01); *H01L 2225/0651* (2013.01); *H01L 2225/06524* (2013.01); *H01L 2225/06541* (2013.01); *H01L 2225/06548* (2013.01); *H01L 2225/06562* (2013.01); *H01L 2924/1431* (2013.01); *H01L 2924/1436* (2013.01); *H01L 2924/1438* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(58) Field of Classification Search
CPC ... H01L 2225/06562; H01L 2924/1431; H01L 2924/1436; H01L 2924/1438; H10B 41/10; H10B 41/27; H10B 41/35; H10B 41/40; H10B 43/10; H10B 43/27; H10B 43/35; H10B 43/40
See application file for complete search history.

(56) References Cited

U.S. PATENT DOCUMENTS

| | | | |
|---|---|---|---|
| 8,729,622 B2 * | 5/2014 | Moon | H10B 43/27 365/103 |
| 9,070,587 B2 | 6/2015 | Hwang et al. | |
| 9,553,102 B2 | 1/2017 | Wang et al. | |
| 2015/0255486 A1 | 9/2015 | Kameoka et al. | |
| 2016/0293618 A1 * | 10/2016 | Namkoong | H01L 29/42328 |
| 2020/0091176 A1 | 3/2020 | Yun et al. | |

* cited by examiner

SEMICONDUCTOR DEVICES AND ELECTRONIC SYSTEMS INCLUDING THE SAME

CROSS-REFERENCE TO RELATED APPLICATION

This U.S. non-provisional application claims priority under 35 U.S.C. § 119 to Korean Patent Application No. 10-2020-0167790 filed on Dec. 3, 2020 in the Korean Intellectual Property Office, the disclosure of which is hereby incorporated by reference in its entirety.

BACKGROUND

The present disclosure relates to semiconductor devices. It may be desirable to have a semiconductor device capable of storing a large amount of data in an electronic system which requires data storage. Therefore, studies have been conducted to increase data storage capacity of semiconductor devices. For example, as an approach to increase data storage capacity of a semiconductor device, the semiconductor device is suggested to include three-dimensionally arranged memory cells instead of two-dimensionally arranged memory cells.

SUMMARY

Some embodiments of the present inventive concepts provide a semiconductor device capable of reducing process failure and improving operating characteristics such as leakage current, which may increase due to contamination.

Some embodiments of the present inventive concepts provide an electronic system including the semiconductor device discussed above.

According to some embodiments of the present inventive concepts, a semiconductor device may comprise: a plurality of gate stack structures on a substrate; a plurality of separation structures that extend in a first direction on the substrate and separate the gate stack structures from each other; and a plurality of vertical structures that penetrate the gate stack structures. Each of the gate stack structures may include: a plurality of electrodes and a plurality of cell dielectric layers that are alternately stacked, the electrodes including a plurality of upper electrodes; a barrier layer that extends between the electrodes and the cell dielectric layers; a separation dielectric pattern that extends in the first direction, the separation dielectric pattern penetrating the upper electrodes to separate each of the upper electrodes into pieces that are spaced apart from each other in a second direction that intersects the first direction; and a plurality of capping patterns between the separation dielectric pattern and the upper electrodes. The capping patterns may be on sidewalls of each of the upper electrodes and may be spaced apart from each other in a third direction perpendicular to a top surface of the substrate. Each of the capping patterns may be on a sidewall of the barrier layer.

According to some embodiments of the present inventive concepts, a semiconductor device may comprise: a plurality of gate stack structures on a substrate; a plurality of separation structures that extend in a first direction on the substrate and separate the gate stack structures from each other; and a plurality of vertical structures that penetrate the gate stack structures. Each of the gate stack structures may include: a plurality of electrodes and a plurality of cell dielectric layers that are alternately stacked, the electrodes including a plurality of upper electrodes; a separation dielectric pattern that extends in the first direction, the separation dielectric pattern penetrating the upper electrodes to separate each of the upper electrodes into pieces that are spaced apart from each other in a second direction that intersects the first direction; and a plurality of capping patterns between the separation dielectric pattern and the upper electrodes. Ones of the capping patterns that are commonly in contact with the same one of the upper electrodes may be spaced apart from each other along the first direction.

According to some embodiments of the present inventive concepts, an electronic system may comprise: a main board; a semiconductor device on the main board; and a controller on the main board and electrically connected to the semiconductor device. The semiconductor device may include: a substrate; a plurality of gate stack structures on the substrate; a plurality of separation structures that extend in a first direction on the substrate and separate the gate stack structures from each other; and a plurality of vertical structures that penetrate the gate stack structures. Each of the gate stack structures may include: a plurality of electrodes and a plurality of cell dielectric layers that are alternately stacked, the electrodes including a plurality of upper electrodes; a barrier layer that extends between the electrodes and the cell dielectric layers; a separation dielectric pattern that extends in the first direction, the separation dielectric pattern penetrating the upper electrodes to separate each of the upper electrodes into pieces that are spaced apart from each other in a second direction that intersects the first direction; and a plurality of capping patterns between the separation dielectric pattern and the upper electrodes. The capping patterns may be on sidewalls of each of the upper electrodes and may be spaced apart from each other in a third direction perpendicular to a top surface of the substrate. Each of the capping patterns may be on a sidewall of the barrier layer.

DETAILED DESCRIPTION

Figure 1:
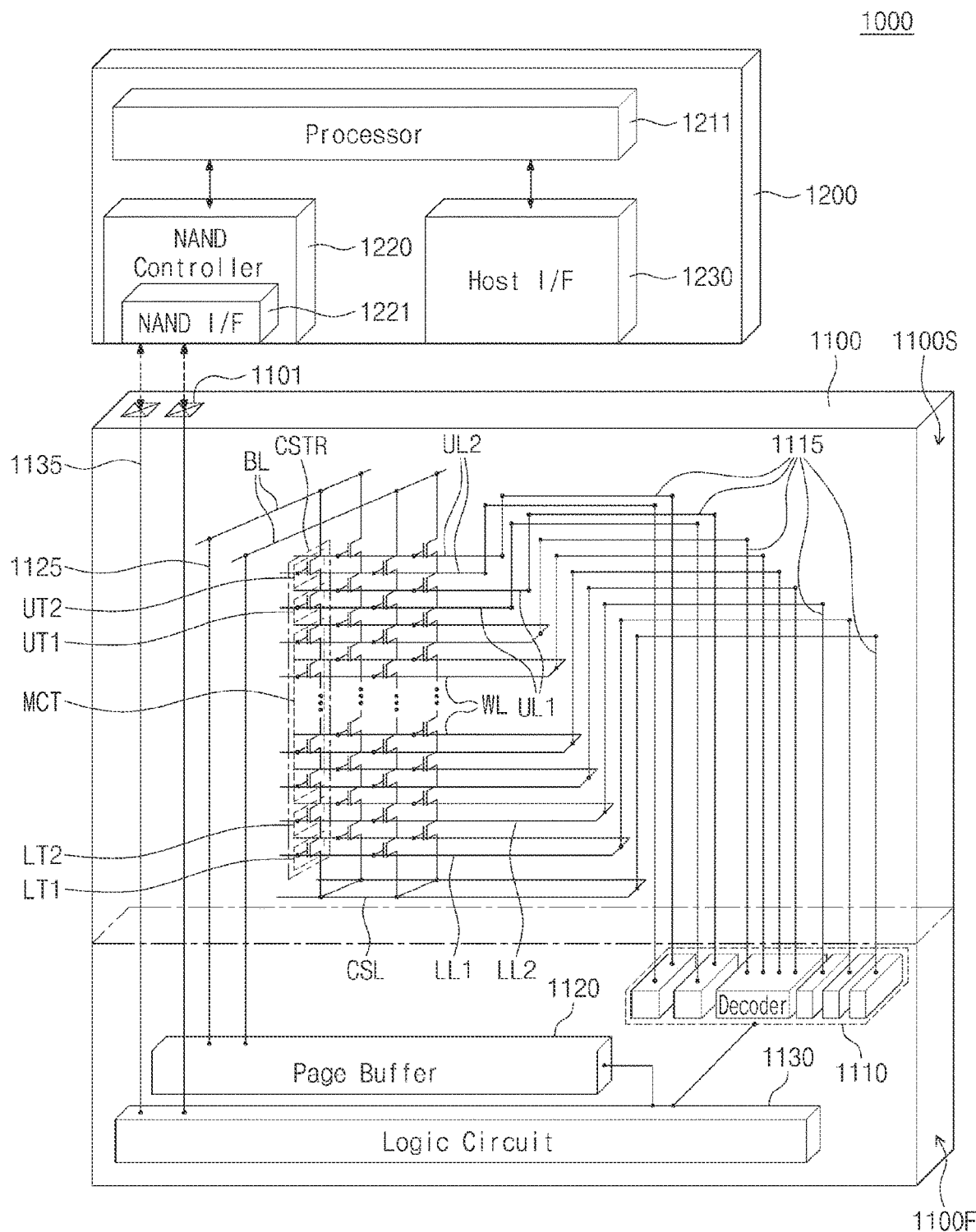
FIG. 1 illustrates a simplified schematic diagram showing an electronic system including a semiconductor device according to some embodiments of the present inventive concepts.

FIG. 1 illustrates a simplified schematic diagram showing an electronic system including a semiconductor device according to some embodiments of the present inventive concepts.

Referring to FIG. 1, an electronic system 1000 according to some embodiments of the present inventive concepts may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as NAND Flash memory device. The semiconductor device 1100 may include a first structure 1100F and a second structure 1100S on the first structure 1100F. For example, the first structure 1100F may be disposed on a side of the second structure 1100S. The first structure 1100F may be a peripheral circuit structure that includes a decoder circuit 1110, a page buffer 1120, and a logic circuit 1130. The second structure 1100S may be a memory cell structure that includes bit lines BL, a common source line CSL, word lines WL, first and second gate upper lines UL1 and UL2, first and second gate lower lines LL1 and LL2, and memory cell strings CSTR between the bit line BL and the common source line CSL.

On the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT2 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

On the first structure 1100F, the decoder circuit 1110 and the page buffer 1120 may perform a control operation for at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1211, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1211 may control an overall operation of the electronic system 1000 including the controller 1200. The processor 1211 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1211 in response to the control command.

Figure 2:
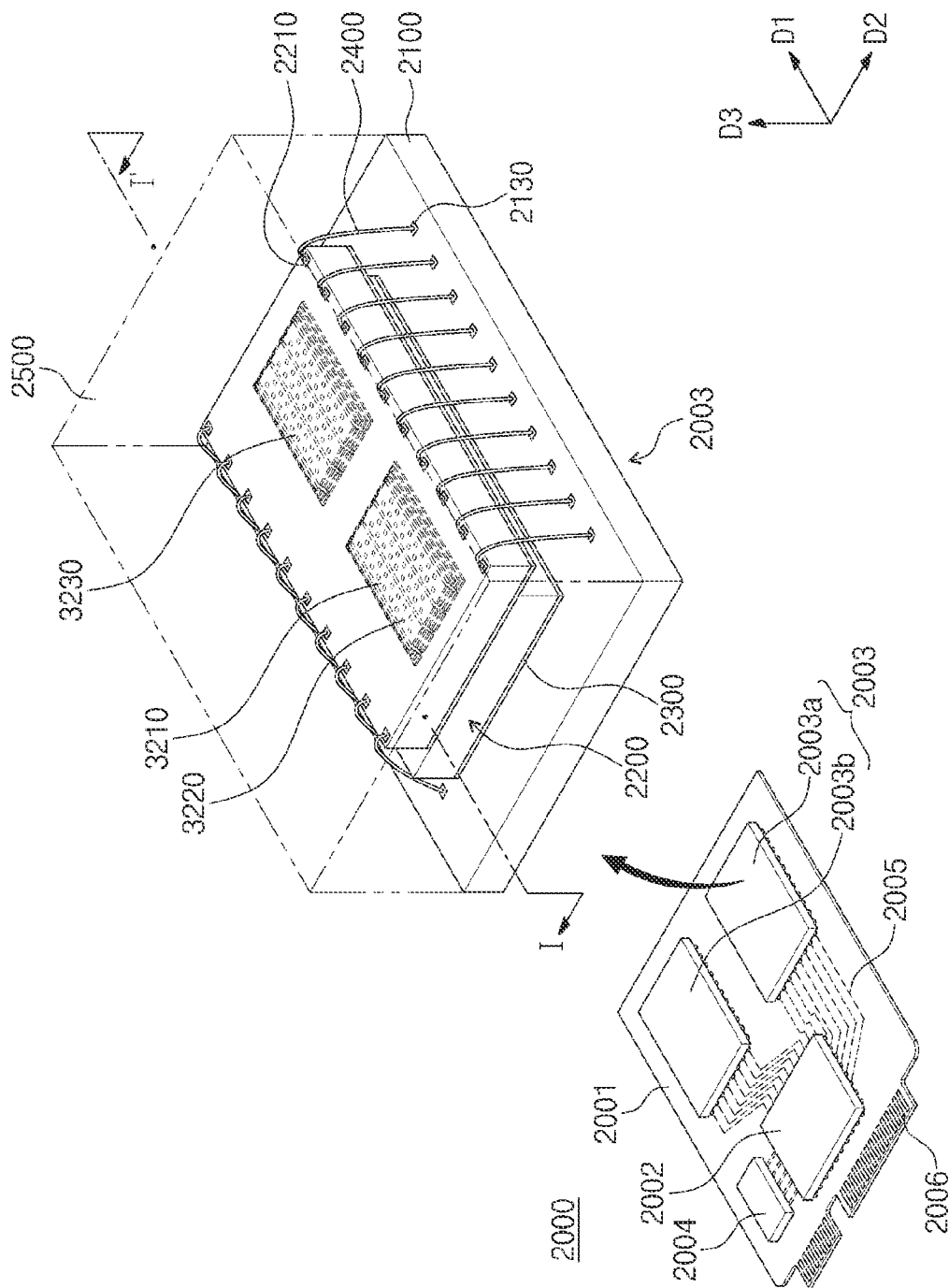
FIG. 2 illustrates a simplified perspective view showing an electronic system including a semiconductor device according to some embodiments of the present inventive concepts.

FIG. 2 illustrates a simplified perspective view showing an electronic system including a semiconductor device according to some embodiments of the present inventive concepts.

FIG. 2, an electronic system 2000 according to some embodiments of the present inventive concepts may include a main board 2001, and may also include a controller 2002, at least one semiconductor package 2003, and a dynamic random access memory (DRAM) 2004 each of which is mounted on the main board 2001. The semiconductor package 2003 and the DRAM 2004 may be connected to the controller 2002 through wiring patterns 2005 formed on the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. In some embodiments, the electronic system 2000 may communicate with the external host through one or more interfaces, for example, universal serial bus (USB), peripheral component interconnect express (PCI-Express), serial advanced technology attachment (SATA), and/or M-PHY for universal flash storage (UFS). In some embodiments, the electronic system 2000 may operate with power supplied through the connector 2006 from an external host. The electronic system 2000 may further include a power management integrated circuit (PMIC) in which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesive layers 2300 disposed on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including package upper pads 2130. Each of the semiconductor chips 2200 may include one or more input/output pads 2210. The input/output pad 2210 may correspond to the input/output pad 1101 of FIG. 1. Each of the semiconductor chips 2200 may include gate stack structures 3210 and vertical structures 3220. Each of the semiconductor chips 2200 may include a semiconductor device according to some embodiments of the present inventive concepts which will be discussed below.

In some embodiments, the connection structures 2400 may be bonding wires that electrically connect the input/output pads 2210 to the package upper pads 2130. On each of the first and second semiconductor packages 2003a and 2003b, the semiconductor chips 2200 may be electrically connected to each other in a wire bonding manner, and may be electrically connected to the package upper pads 2130 of the package substrate 2100. In some embodiments, on each of the first and second semiconductor packages 2003a and 2003b, the semiconductor chips 2200 may be electrically connected to each other through connection structures such as through silicon vias instead of the connection structures 2400 shaped like bonding wires.

In some embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines provided in the interposer substrate.

Figure 3:
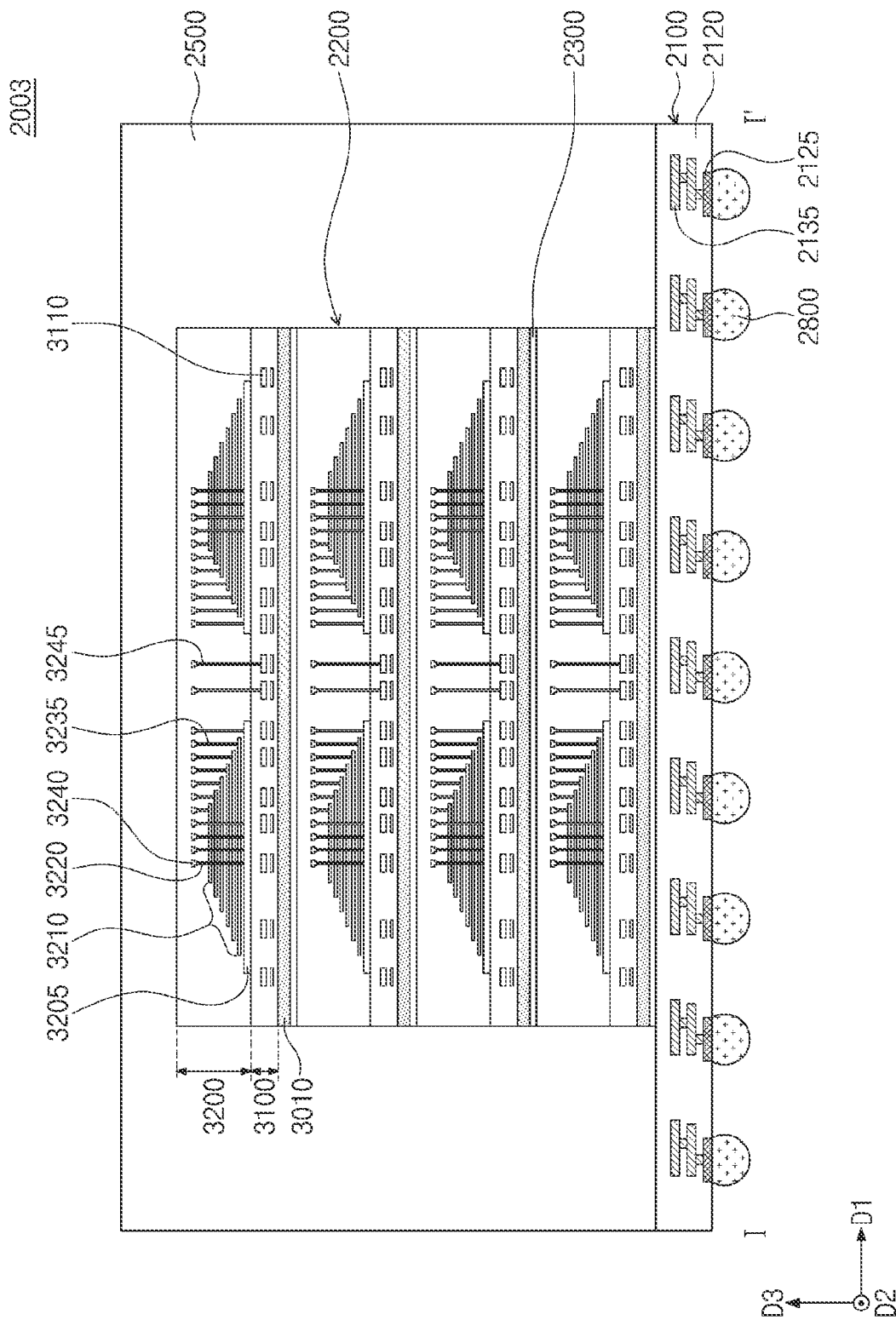
FIGS. 3 and 4 illustrate simplified cross-sectional views taken along line I-I' of FIG. 2, conceptually showing examples of a semiconductor package according to some embodiments of the present inventive concepts.
Figure 4:
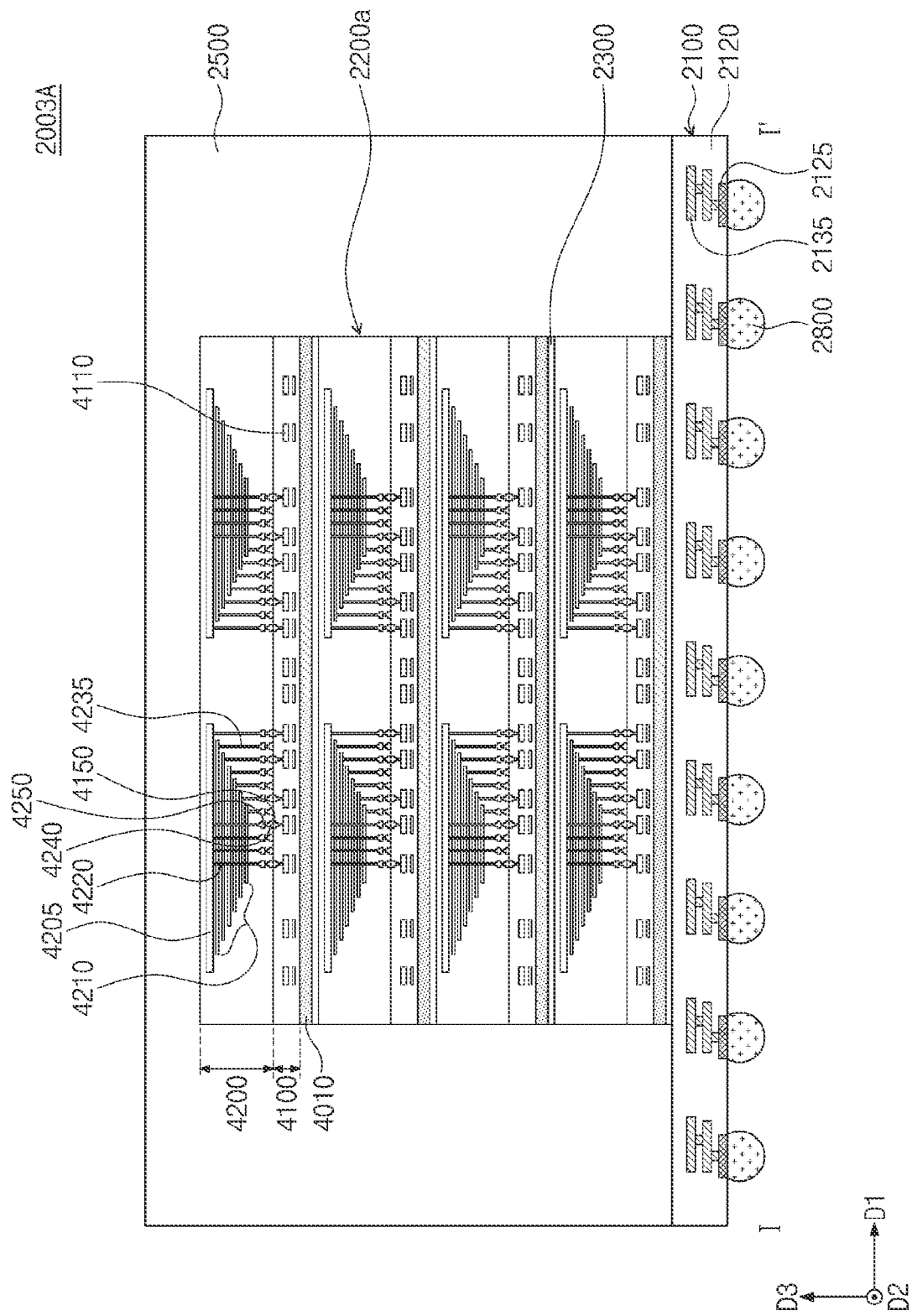

FIGS. 3 and 4 illustrate simplified cross-sectional views showing a semiconductor package according to some embodiments of the present inventive concepts. FIGS. 3 and 4 each depict an example of the semiconductor package illustrated in FIG. 2, conceptually showing a section taken along line I-I' of the semiconductor package depicted in FIG. 2.

Referring to FIG. 3, a printed circuit board may be used as the package substrate 2100 of the semiconductor package 2003. The package substrate 2100 may include a package substrate body 2120, package upper pads (e.g., the package upper pads 2130 of FIG. 2) disposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The lower pads 2125 may be connected through the conductive connectors 2800 to the wiring patterns 2005 of the main board 2001 in the electronic system 2000.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral lines 3110. The second structure 3200 may include a source structure 3205, a stack structure 3210 on the source structure 3205, vertical structures 3220 that penetrate the stack structure 3210, bit lines 3240 electrically connected to the vertical structures 3220, and cell contact plugs 3235 electrically connected to word lines (e.g., the word lines WL of FIG. 1) of the stack structure 3210. The second structure 3200 may further include separation structures (e.g., separation structures 3230 of FIG. 2), which will be discussed below.

Each of the semiconductor chips 2200 may include one or more through lines 3245 that have electrical connection with the peripheral lines 3110 of the first structure 3100 and extend into the second structure 3200. The through line 3245 may be disposed outside the stack structure 3210 or may be disposed to penetrate the stack structure 3210. Each of the semiconductor chips 2200 may further include one or more input/output pads (e.g., the input/output pads 2210 of FIG. 2) electrically connected to the peripheral lines 3110 of the first structure 3100.

Referring to FIG. 4, a semiconductor package 2003A may be configured such that each of a plurality of semiconductor chips 2200a may include a semiconductor substrate 4010, a first structure 4100 on the semiconductor substrate 4010, and a second structure 4200 disposed on and wafer-bonded to the first structure 4100.

The first structure 4100 may include a peripheral circuit region including peripheral lines 4110 and first bonding structures 4150. The second structure 4200 may include a source structure 4205, a stack structure 4210 between the source structure 4205 and the first structure 4100, vertical structures 4220 that penetrate the stack structure 4210, and second bonding structures 4240 electrically connected to the vertical structures 4220 and word lines (e.g., the word lines WL of FIG. 1) of the stack structure 4210. For example, the second bonding structures 4240 may be electrically connected to the vertical structures 4220 through bit lines 4250 electrically connected to the vertical structures 4220, and may also be electrically connected to the word lines (e.g., the word lines WL of FIG. 1) through cell contact plugs 4235 electrically connected to the word lines (e.g., the word lines WL of FIG. 1). The first bonding structures 4150 of the first structure 4100 and the second bonding structures 4240 of the second structure 4200 may be coupled to each other while being in contact with each other. The first and second bonding structures 4150 and 4240 may have their bonding portions formed of, for example, copper (Cu). Each of the semiconductor chips 2200a may further include one or more input/output pads (e.g., the input/output pads 2210 of FIG. 2) electrically connected to the peripheral lines 4110.

The semiconductor chips 2200 of FIG. 3 may be electrically connected to each other through connection structures (e.g., the connection structures 2400 of FIG. 2) shaped like bonding wires, and this may also be applicable to the semiconductor chips 2200a of FIG. 4. In some embodiments, semiconductor chips, such as the semiconductor chips 2200 of FIG. 3 or the semiconductor chips 2200a of FIG. 4, in a single semiconductor package may be electrically connected to each other through one or more connection structures that include through electrodes such as TSV (through silicon via).

The first structure 3100 of FIG. 3 and the first structure 4100 of FIG. 4 may correspond to a peripheral circuit structure which will be discussed below, and the second structure 3200 of FIG. 3 and the second structure 4200 of FIG. 4 may correspond to a cell array structure which will be discussed below.

Figure 5:
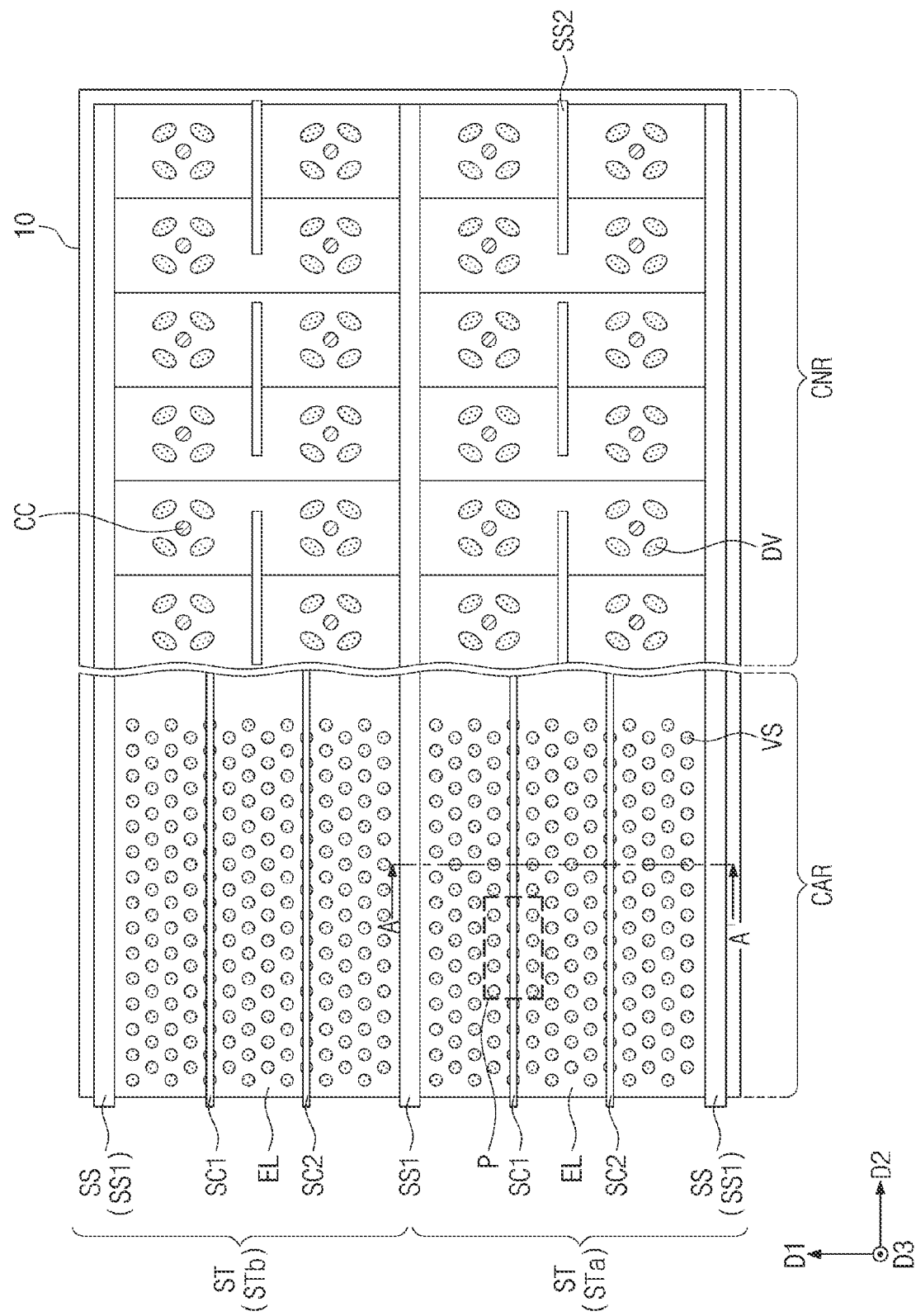
FIG. 5 illustrates a plan view showing a semiconductor device according to some embodiments of the present inventive concepts.
Figure 6:
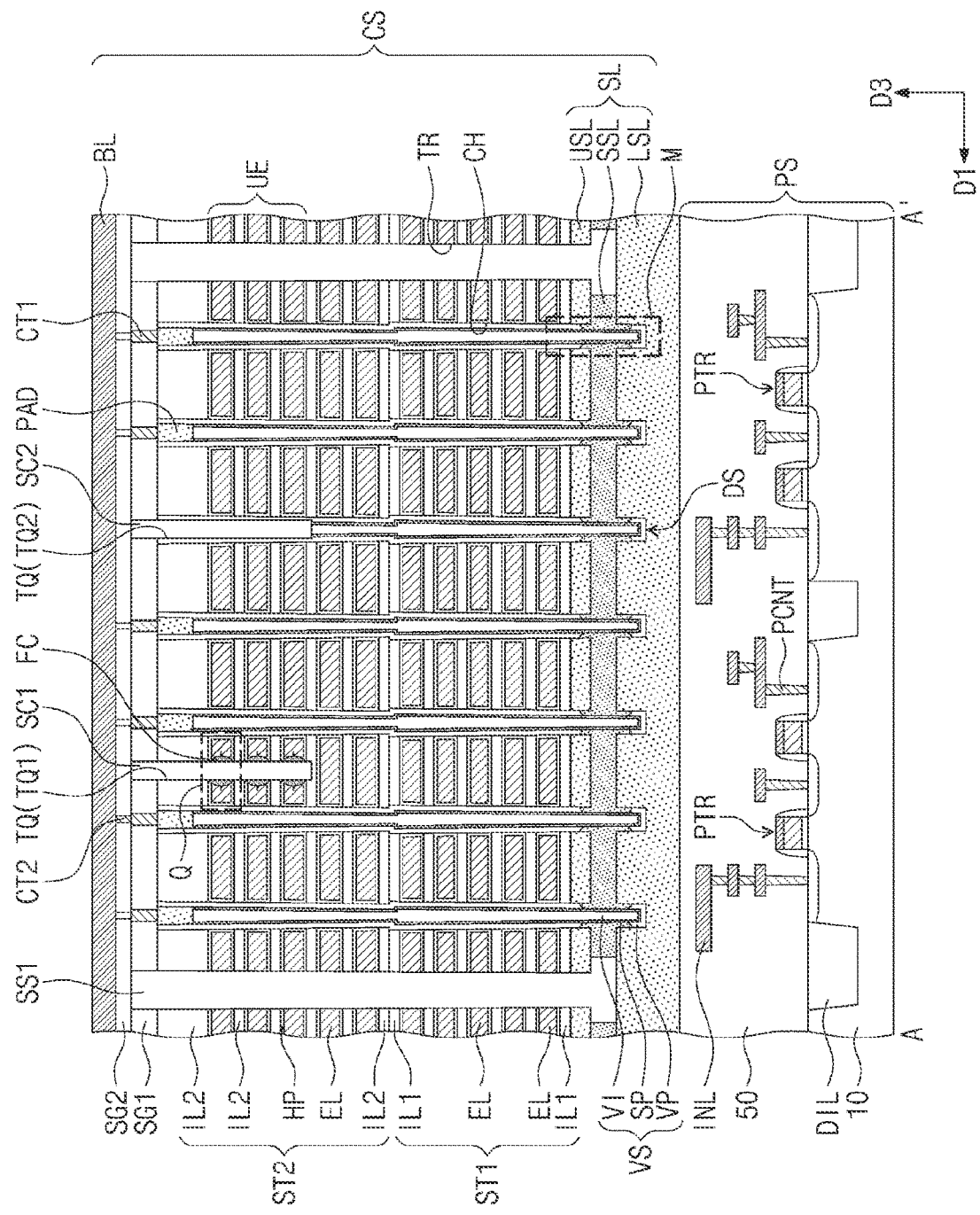
FIG. 6 illustrates a cross-sectional view taken along line A-A' of FIG. 5.
Figure 7:
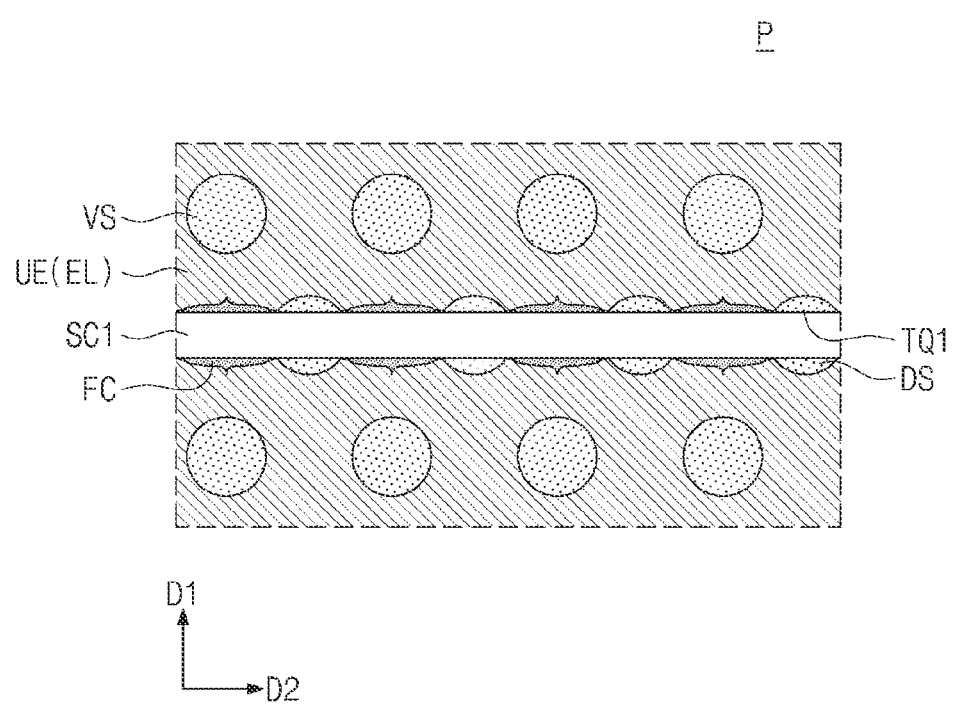
FIG. 7 illustrates an enlarged view showing section P of FIG. 5.
Figure 8:
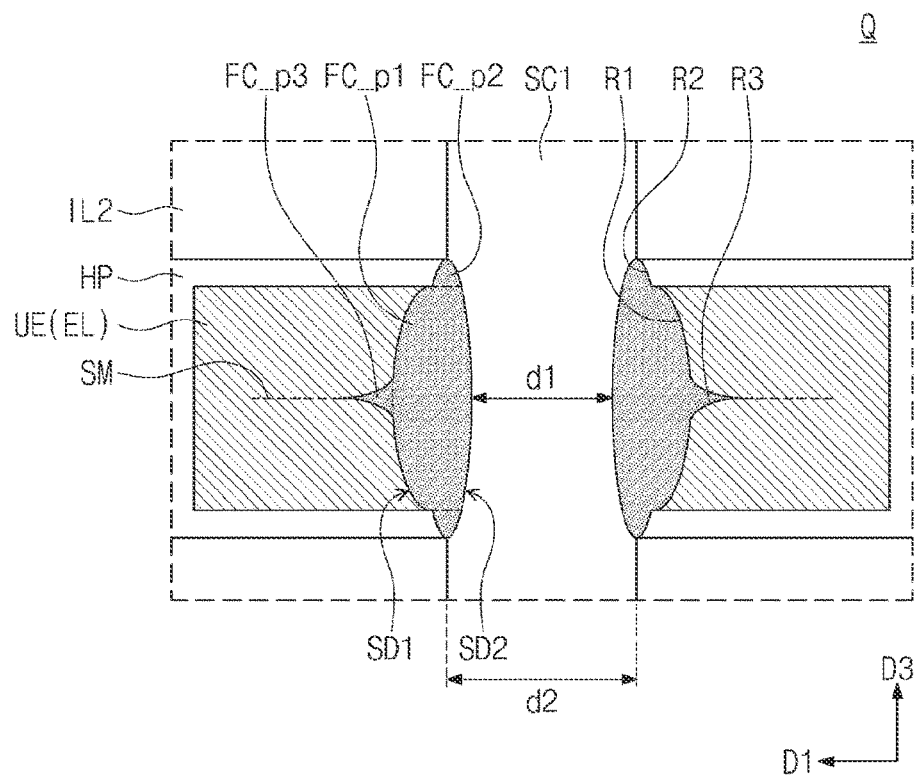
FIGS. 8 and 9 illustrate enlarged views showing section Q of FIG. 6.
Figure 9:
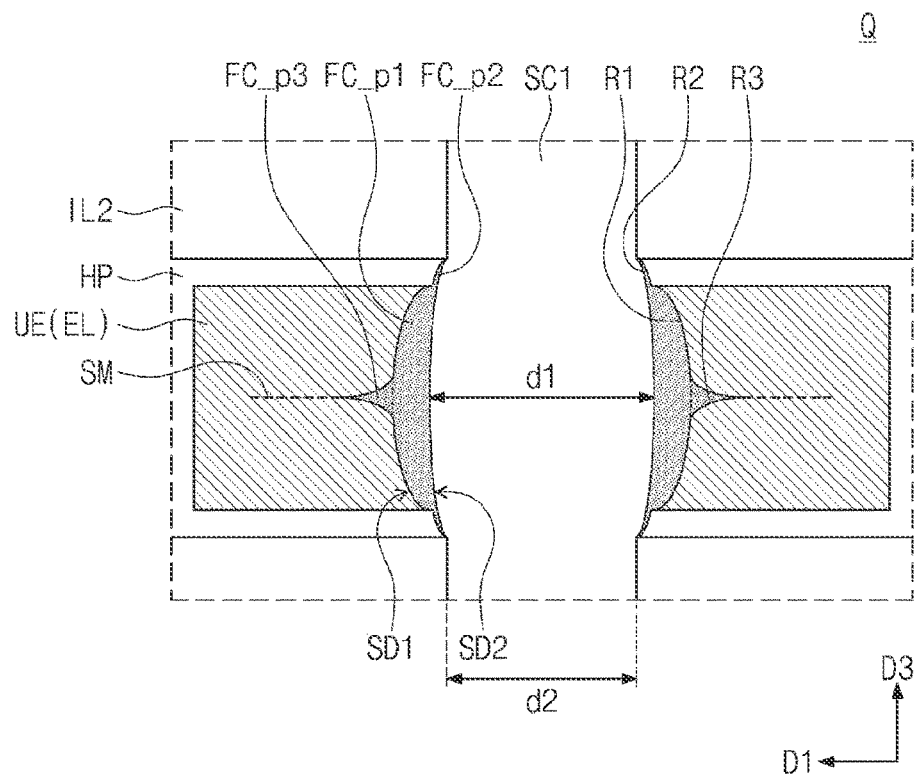
Figure 10:
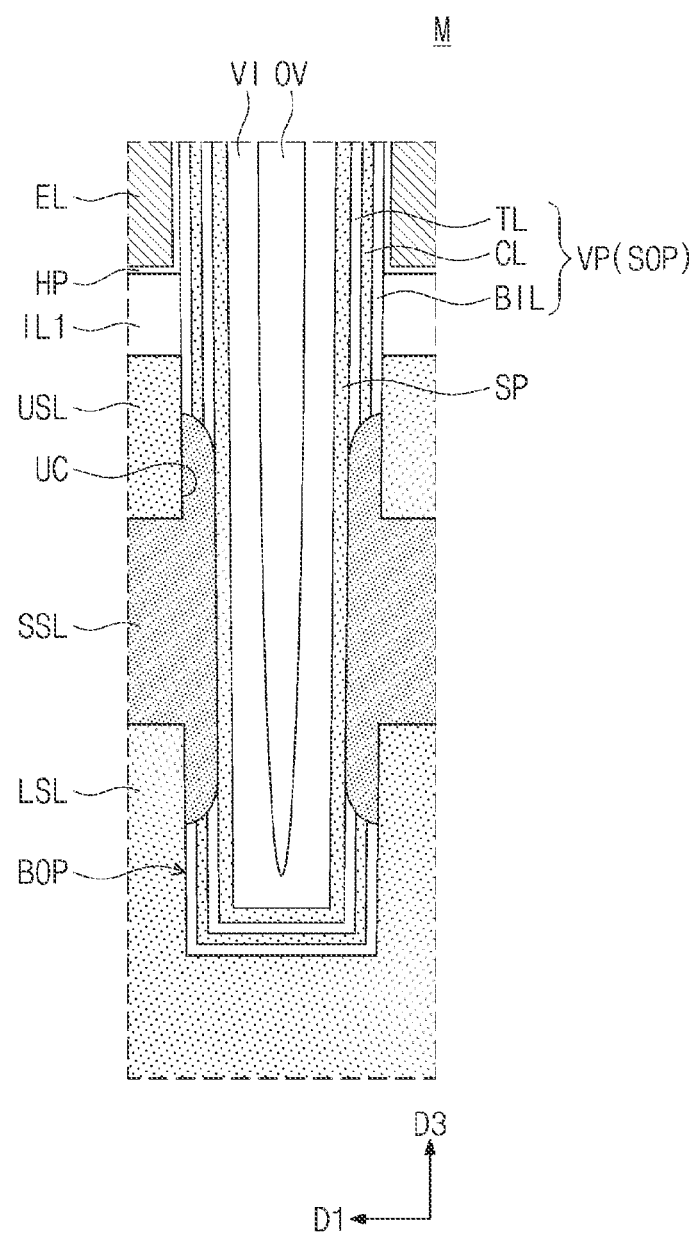
FIG. 10 illustrates an enlarged view showing section M of FIG. 6.

FIG. 5 illustrates a plan view showing a semiconductor device according to some embodiments of the present inventive concepts. FIG. 6 illustrates a cross-sectional view taken along line A-A' of FIG. 5. FIG. 7 illustrates an enlarged view showing section P of FIG. 5. FIGS. 8 and 9 illustrate enlarged views showing section Q of FIG. 6. FIG. 10 illustrates an enlarged view showing section M of FIG. 6. A semiconductor device of FIG. 5 may be a portion of the semiconductor device discussed with reference to FIGS. 1 to 4.

FIGS. 5 to 10, a first substrate 10 may be provided thereon with a peripheral circuit structure PS that includes peripheral transistors PTR. The peripheral circuit structure PS may be provided thereon with a cell array structure CS that includes gate stack structures ST. The first substrate 10 may be a silicon substrate, a silicon-germanium substrate, a germanium substrate, or a single-crystalline epitaxial layer grown on a single-crystalline silicon substrate. The first substrate 10 may include active regions defined by a device isolation layer DIL. The peripheral transistors PTR, as discussed above, may constitute row and column decoders, a page buffer, and a peripheral circuit.

The peripheral circuit structure PS may include lower wiring lines INL that are provided on the peripheral transistors PTR and a first interlayer dielectric layer 50 that covers the peripheral transistors PTR and the lower wiring lines INL. A peripheral contact PCNT may lie between and electrically connect the lower wiring line INL and the peripheral transistor PTR. The first interlayer dielectric layer 50 may include a plurality of stacked dielectric layers. For example, the first interlayer dielectric layer 50 may include one or more of a silicon oxide layer, a silicon nitride layer, a silicon oxynitride layer, and a low-k dielectric layer.

The cell array structure CS may be provided on the first interlayer dielectric layer 50 of the peripheral circuit structure PS. The following will describe in detail the cell array structure CS. A second substrate SL may be provided on the first interlayer dielectric layer 50. The second substrate SL may support the gate stack structures ST provided thereon.

The second substrate SL may include a lower semiconductor layer LSL, a source semiconductor layer SSL, and an upper semiconductor layer USL that are sequentially stacked. Each of the lower semiconductor layer LSL, the source semiconductor layer SSL, and the upper semiconductor layer USL may include at least one selected from a semiconductor material, such as silicon (Si), germanium (Ge), silicon-germanium (SiGe), gallium-arsenide (GaAs), indium-gallium-arsenide (InGaAs), aluminum-gallium-arsenide (AlGaAs), and any mixture thereof. Each of the lower semiconductor layer LSL, the source semiconductor layer SSL, and the upper semiconductor layer USL may be single-crystalline, amorphous, and/or polycrystalline. For example, each of the lower semiconductor layer LSL, the source semiconductor layer SSL, and the upper semiconductor layer USL may include a polysilicon layer into which impurities are doped to have an n-type conductivity. The lower semiconductor layer LSL, the source semiconductor layer SSL, and the upper semiconductor layer USL may have respective impurity concentrations different from each other. For example, the source semiconductor layer SSL may have an impurity concentration greater than that of each of the lower and upper semiconductor layers LSL and USL.

The second substrate SL, as shown in FIG. 5, may include a cell array region CAR and a connection region CNR. The cell array region CAR may be provided on a center of the second substrate SL. The connection region CNR may be disposed on at least one side of the cell array region CAR. The lower semiconductor layer LSL may be connected through the source semiconductor layer SSL to the upper semiconductor layer USL.

Each of the gate stack structures ST may include electrodes EL that are stacked in a vertical direction (e.g., a third direction D3) on the second substrate SL. For example, the gate stack structure ST may include a lower gate stack structure ST1 and an upper gate stack structure ST2 on the lower gate stack structure ST1. The following description will be based on two gate stack structures, but alternatively, a single gate stack structure may be provided or at least three gate stack structures may be provided. The lower gate stack structure ST1 may include first cell dielectric layers IL1 that separate the stacked electrodes EL from each other. The upper gate stack structure ST2 may include second cell dielectric layers IL2 and electrodes EL that are alternately stacked. The first cell dielectric layers IL1 and the electrodes EL of the lower gate stack structure ST1 may be alternately stacked in the third direction D3. The second cell dielectric layers IL2 and the electrodes EL of the upper gate stack structure ST2 may be alternately stacked in the third direction D3. An uppermost second cell dielectric layer IL2 of the upper gate stack structure ST2 may be thicker than the first cell dielectric layers IL1 and the second cell dielectric layers IL2 that underlie the uppermost second cell dielectric layer IL2. An uppermost first cell dielectric layer IL1 of the lower gate stack structure ST1 may be in contact with a lowermost second cell dielectric layer IL2 of the upper gate stack structure ST2.

The gate stack structure ST may extend from the cell array region CAR toward the connection region CNR. The gate stack structure ST may have on the connection region CNR a stepwise structure as shown in FIGS. 2 to 5. The stepwise structure of the gate stack structure ST may have a height that decreases with increasing distance from the cell array region CAR. For example, the stepwise structure of the gate stack structure ST may have a height that decreases in a second direction D2 from the cell array region CAR. The stepwise structure may expose ends of the electrodes EL, and cell contact plugs CC may be connected to the ends of the electrodes EL.

A pair of lowermost electrodes EL of the gate stack structure ST may be gate electrodes of the lower transistors LT1 and LT2 discussed with reference to FIG. 1. The gate stack structure ST may have uppermost electrodes EL (referred to hereinafter as upper electrodes UE) that are penetrated with separation dielectric patterns which will be discussed below. Word lines may be defined to refer to other electrodes between the lowermost electrodes EL and the upper electrodes UE.

Three upper electrodes UE are illustrated, but alternatively, only two upper electrodes UE or fourth to sixth electrodes EL may be provided. When three upper electrodes UE are provided, an uppermost one of the upper electrodes UE may be a gate electrode of the upper erasure transistor UT2 discussed with reference to FIG. 1, a lowermost one of the upper electrodes UE may be a dummy gate electrode, and the remaining one of the upper electrodes UE may be a gate electrode of the string selection transistor UT1 discussed with reference to FIG. 1. Alternatively, one or both of the dummy gate electrode and the gate electrode of the upper erasure transistor UT2 may not be provided, or two of three upper electrodes UE may be gate electrodes of the upper erasure transistors UT2 or gate electrodes of the string selection transistors UT1. Dissimilarly, five upper electrodes UE may be provided, and two of the upper electrodes UE may be gate electrodes of the upper erasure transistors UT2, another two of the upper electrodes UE may be gate electrodes of the string selection transistors UT1, and a lowermost one of the upper electrodes UE may be a dummy gate electrode.

Each of the electrodes EL may include at least one selected from doped semiconductors (e.g., doped silicon), metals (e.g., tungsten, copper, or aluminum), conductive metal nitrides (e.g., titanium nitride or tantalum nitride), and transition metals (e.g., titanium or tantalum). Each of the first and second cell dielectric layers IL1 and IL2 may include a silicon oxide layer.

The cell array region CAR may be provided thereon with a plurality of vertical structures VS that penetrate the gate stack structure ST. For example, referring to FIG. 5, a first column may be constituted by seven vertical structures VS that penetrate the stack structure ST and are arranged in a first direction D1, and a second column may be constituted by another seven vertical structures VS that are adjacent to the seven vertical structures VS and are arranged in the first direction D1. The first column and the second column may be repeatedly and alternately arranged along the second direction D2. Each of the vertical structures VS may have a diameter that gradually decreases with decreasing distance from the second substrate SL. In some embodiments of the present inventive concepts, the vertical structures VS may include a stepped part whose diameter is discontinuously changed at a boundary between the lower gate stack structure ST1 and the upper gate stack structure ST2.

On the connection region CNR, support structures DV may be provided to penetrate the gate stack structure ST. The support structures DV may penetrate the stepwise structure of the gate stack structure ST. When viewed in plan, each of the support structures DV may have a size (e.g., maximum diameter) greater than a size (e.g., maximum diameter) of each of the vertical structures VS.

The vertical structures VS may be provided in corresponding channel holes CH that penetrate the gate stack structure ST. Each of the vertical structures VS may include a vertical dielectric pattern VP, a vertical semiconductor pattern SP, and a buried dielectric pattern VI. The vertical semiconductor pattern SP may be interposed between the vertical dielectric pattern VP and the buried dielectric pattern VI. A conductive pad PAD may be provided on an upper portion of each of the vertical structures VS.

The vertical semiconductor pattern SP may be spaced apart from the electrodes EL by the vertical dielectric pattern VP. For example, the vertical dielectric pattern VP, the vertical semiconductor pattern SP, and the buried dielectric pattern VI may be sequentially provided in the channel hole CH.

The vertical dielectric pattern VP may be formed of a single thin layer or a plurality of thin layers. In some embodiments of the present inventive concepts, the vertical dielectric pattern VP may include a data storage layer. As one embodiment of the present inventive concepts, as illustrated in FIG. 10, the vertical dielectric pattern VP may include a tunnel dielectric layer TL, a charge storage layer CL, and a blocking dielectric layer BIL, which constitute a data storage layer of a NAND Flash memory device.

For example, the charge storage layer CL may be a trap dielectric layer, a floating gate electrode, or a dielectric layer including conductive nano-dots. The charge storage layer CL may include at least one selected from a silicon nitride layer, a silicon oxynitride layer, a silicon-rich nitride layer, a nano-crystalline silicon layer, or a laminated trap layer. The tunnel dielectric layer TL may include a material whose band gap is greater than that of the charge storage layer CL. The tunnel dielectric layer TL may include a silicon oxide layer or a high-k dielectric layer such as an aluminum oxide layer or a hafnium oxide layer. The blocking dielectric layer BIL may include one or more of a silicon oxide layer and an aluminum oxide layer.

The vertical semiconductor pattern SP may include a semiconductor material, such as silicon (Si), germanium (Ge), or a mixture thereof. Additionally or alternatively, the vertical semiconductor pattern SP may be an impurity-doped semiconductor or an undoped intrinsic semiconductor. For example, the vertical semiconductor pattern SP may include polysilicon. The vertical semiconductor patterns SP including a semiconductor material may be used as a channel of transistors that constitute a NAND cell string.

The conductive pad PAD may cover a top surface of the vertical semiconductor pattern SP and a top surface of the buried dielectric pattern VI. The conductive pad PAD may include an impurity-doped semiconductor material and/or a metallic material. A first contact plug CT1 may be electrically connected through the conductive pad PAD to the vertical semiconductor pattern SP.

The source semiconductor layer SSL may be in direct contact with a lower portion of each of the vertical semiconductor patterns SP. On the cell array region CAR, the source semiconductor layer SSL may electrically connect a plurality of vertical semiconductor patterns SP to each other. For example, the vertical semiconductor patterns SP of the vertical structures VS may be electrically connected to the source semiconductor layer SSL. The source semiconductor layer SSL may be provided with a common source voltage.

Like the vertical structures VS discussed above, each of the support structures DV may include a vertical dielectric pattern VP, a vertical semiconductor pattern SP, and a buried dielectric pattern VI. Different from the vertical structures VS, the support structures DV may not serve as a channel of memory cell. The support structures DV may not be connected to bit lines BL which will be described below. In this case, the support structures DV may each be a dummy that does not work as a circuit. The support structures DV may act as pillars (or supporters) that physically support the stepwise structure of the gate stack structure ST.

A plurality of separation structures SS may be provided to penetrate the gate stack structure ST. The separation structures SS may be provided in trenches TR between the gate stack structures ST. The trenches TR may expose a top surface of the lower semiconductor layer LSL. The separation structures SS may extend in parallel to each other in the second direction D2. When viewed in plan, each of the separation structures SS may have a linear or bar shape that extends in the second direction D2. For example, each of first separation structures SS1 may extend from the cell array region CAR toward the connection region CNR, and may horizontally divide one electrode EL into a plurality of electrodes EL. For example, the first separation structures SS1 may separate a plurality of gate stack structures ST from each other in the first direction D1. The first separation structures SS1 may extend between the gate stack structures ST and may define each of the gate stack structures ST. For example, as shown in FIG. 5, the first separation structure SS1 may extend between a first gate stack structure STa and a second gate stack structure STb.

For example, second separation structures SS2 may be provided on the connection region CNR and may have bar shapes that are divided from each other. The second separation structures SS2 may be provided in corresponding gate stack structures ST. The separation structures SS may include a dielectric material, such as silicon oxide.

A barrier layer HP may be provided between the electrodes EL and the cell dielectric layers IL1 and IL2. The barrier layer HP may extend between the electrodes EL and the vertical structures VS. The barrier layer HP may include metal nitride, such as titanium nitride, tantalum nitride, or tungsten nitride. The barrier layer HP may further include a transition metal layer including titanium or tantalum in addition to the metal nitride. Alternatively, the barrier layer HP may include a high-k dielectric metal oxide layer, such as an aluminum oxide layer or a hafnium oxide layer.

A second interlayer dielectric layer SG1 and a third interlayer dielectric layer SG2 may be sequentially provided on the upper gate stack structure ST2. The second interlayer dielectric layer SG1 may have first contact plugs CT1 provided therein. The third interlayer dielectric layer SG2 may have second contact plugs CT2 provided therein. The second and third interlayer dielectric layers SG1 and SG2 may include silicon oxide. The third interlayer dielectric layer SG2 may be provided thereon with bit lines BL. The bit lines BL may extend in parallel to each other in the first direction D1. The bit lines BL may be connected to the conductive pads PAD through the first and second contact plugs CT1 and CT2. A plurality of upper wiring lines may be disposed on the cell contact plugs CC. Although not shown, the bit lines BL and the upper wiring lines may be electrically connected via through contacts to the lower wiring lines INL of the peripheral circuit structure PS.

Each of the gate stack structures ST may include separation dielectric patterns SC1 and SC2 disposed between a pair of first separation structures SS1. For example, a pair of separation dielectric patterns SC1 and SC2 may be provided between a pair of first separation structures SS1. Alternatively, a single separation dielectric pattern may be provided, or three or more separation dielectric patterns may be provided. The following will discuss an example in which a pair of separation dielectric patterns SC1 and SC2 are provided in each gate stack structure ST.

The separation dielectric patterns SC1 and SC2 may extend in the second direction D2 and may penetrate the upper electrodes UE. In this case, the separation dielectric patterns SC1 and SC2 may separate the upper electrodes UE from each other in the first direction D1. For example, a first separation dielectric pattern SC1 and a second separation dielectric pattern SC2 may separate each upper electrode UE into three pieces (i.e., separate portions) that are located at the same level and spaced apart from each other in the first direction D1. Each of the first and second separation dielectric patterns SC1 and SC2 may overlap the vertical structures VS that are arranged along the second direction D2. In the following description, dummy vertical structures DS may be defined to refer to ones of the vertical structures VS that are overlapped by the separation dielectric patterns SC1 and SC2. For example, the first and second separation dielectric patterns SC1 and SC2 may extend continuously in the second direction D2 to overlap each of a first plurality of dummy vertical structures DS and each of a second plurality of dummy vertical structures DS, respectively.

The first separation dielectric pattern SC1 and the second separation dielectric pattern SC2 may be respectively provided in a first separation region TQ1 and a second separation region TQ2 each of which penetrates the upper electrodes UE. As shown in FIG. 6, a separation region TQ may penetrate upper portions of the dummy vertical structures DS. For example, the separation dielectric patterns SC1 and SC2 may be in contact with inner walls of the vertical dielectric patterns VP of the dummy vertical structures DS. The separation dielectric patterns SC1 and SC2 may have their top surfaces at substantially the same level as that of a top surface of the second interlayer dielectric layer SG1. The separation dielectric patterns SC1 and SC2 may each have a bottom surface higher than a top surface of the electrode EL immediately below the upper electrodes UE.

With reference to FIGS. 6 to 9, capping patterns will be discussed in detail below.

Capping patterns FC may be provided between the upper electrodes UE and the separation dielectric patterns SC1 and SC2. The capping patterns FC may include a conductive material (and thus may be conductors), such as polycrystalline silicon, metal, or metal nitride. Alternatively, the capping patterns FC may include a dielectric material, such as a silicon nitride layer.

For example, as illustrated in FIG. 6, the capping patterns FC may be correspondingly disposed on sidewalls of the upper electrodes UE and may be spaced apart from each other in the third direction D3. In such a configuration, the capping patterns FC may be separated from each other by the second cell dielectric layers IL2 between neighboring upper electrodes UE.

As depicted in FIGS. 8 and 9, the capping patterns FC may have mirror symmetry about the separation dielectric pattern SC1 or SC2. For brevity of description, the following will be explained based on the first separation dielectric pattern SC1, but this explanation may also be applicable to the capping patterns FC in contact with the second separation dielectric pattern SC2.

Each of the capping patterns FC may have a first sidewall SD1 in contact with the upper electrode UE and a second sidewall SD2 in contact with the first separation dielectric pattern SC1. The first sidewall SD1 may have a convex shape in a direction toward the upper electrode UE or in a direction away from the first separation dielectric pattern SC1. As shown in FIG. 8, the second sidewall SD2 may have a convex shape toward the first separation dielectric pattern SC1. In this case, a distance d1 between a pair of capping patterns FC horizontally spaced apart from each other across the first separation dielectric pattern SC1 may be less than a width d2 of the first separation dielectric pattern SC1. Alternatively, as shown in FIG. 9, the second sidewall SD2 may have a convex shape in a direction toward the upper electrode UE or in a direction away from the first separation dielectric pattern SC1. In this case, a distance d1 between a pair of capping patterns FC horizontally spaced apart from each other across the first separation dielectric pattern SC1 may be greater than a width d2 of the first separation dielectric pattern SC1.

The capping pattern FC may include a first part FC_p1 that is on (e.g., that covers) a sidewall of the upper electrode UE, and may also include second parts FC_p2 that vertically extend from the first part FC_p1 and are on (e.g., cover) sidewalls of the barrier layer HP. For example, the second parts FC_p2 may be disposed above and below the first part FC_p1. The first part FC_p1 may be provided in a first recess R1 defined by the sidewall of the upper electrode UE, and the second parts FC_p2 may be provided in second recess R2 defined by the sidewalls of the barrier layer HP. As shown in FIGS. 8 and 9, the first part FC_p1 may have a thickness in the first direction D1 greater than a thickness in the first direction D1 of each of the second parts FC_p2. For example, the thickness of the first part FC_p1 may range from about 1 nanometer (nm) to about 5 nm. The second parts FC_p2 may be connected to the second cell dielectric layers IL2 adjacent thereto. For example, the second parts FC_p2 may extend onto sidewalls of the second cell dielectric layers IL2, but the present inventive concepts are not limited thereto.

The capping pattern FC may include a third part FC_p3 that protrudes from the first part FC_p1 into the upper electrode UE. For example, the third part FC_p3 may have a wedge shape. The third part FC_p3 may be connected to a seam SM in the upper electrode UE. The seam SM may be an area where no solid material is provided, which area may be a space in vacuum or a space occupied by gaseous material. For example, the third part FC_p3 may be provided in a third recess R3 spatially connected to the seam SM. Differently from that shown, the third part FC_p3 may not be provided.

As shown in FIG. 7, ones of the capping patterns FC that are in contact with the same upper electrode UE (i.e., commonly in contact therewith) may be spaced apart from each other along the second direction D2. For example, the capping patterns FC may be provided on opposite sidewalls of the upper electrode UE exposed to the first separation region TQ1, but may not be provided on the dummy vertical structures DS exposed to the first separation region TQ1. As a result, the capping patterns FC and the dummy vertical structures DS may be alternately disposed along a sidewall of the first separation dielectric pattern SC1.

With reference to FIGS. 5 and 10, the following will discuss in detail a lower structure of the vertical structure VS.

A lower portion of the vertical structure VS may include an air gap OV. For example, at least a portion of the air gap OV may be located at the same level as that of the source semiconductor layer SSL. The air gap OV may be an area where no solid material is provided, which area may be a space in vacuum or a space occupied by gaseous material. The source semiconductor layer SSL may horizontally extend to penetrate the vertical dielectric pattern VP. The vertical dielectric pattern VP may be separated into a lower pattern BOP and an upper pattern SOP that are spaced apart from each other by the source semiconductor layer SSL that fills an undercut region UC. The undercut region UC may have a ring shape around the vertical semiconductor pattern SP and may be filled with the source semiconductor layer SSL. A thickness in the third direction D3 of the source semiconductor layer SSL may be greater than that of a certain section (e.g., below the upper semiconductor layer USL) between the lower pattern BOP and the upper pattern SOP. For example, the source semiconductor layer SSL may include a part that protrudes toward the lower pattern BOP and a part that protrudes toward the upper pattern SOP. The buried dielectric pattern VI may include one or more of silicon oxide and silicon oxynitride.

According to some embodiments of the present inventive concepts, the capping patterns FC may be provided between the sidewalls of the upper electrodes UE and the separation dielectric patterns SC1 and SC2. As discussed below in connection with the following fabrication method, the capping patterns FC may reduce a leakage current between gate electrodes that occurs due to electrode material residues that can be produced when the separation regions TQ are formed, and accordingly, a semiconductor may improve in operating characteristics.

Figure 11:
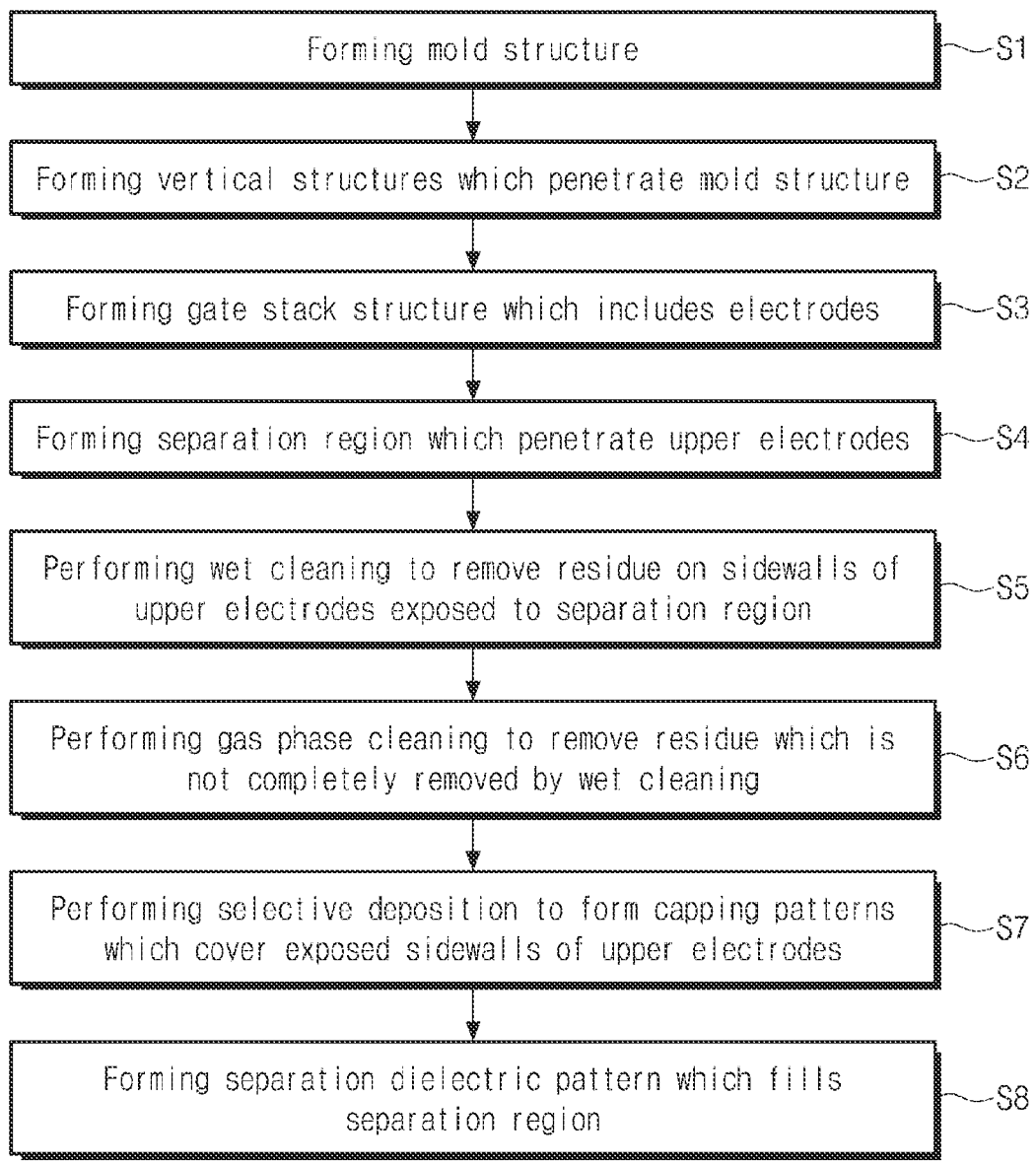
FIG. 11 illustrates a flow chart showing a method of fabricating a semiconductor device according to some embodiments of the present inventive concepts.

FIG. 11 illustrates a flow chart showing a method of fabricating a semiconductor device according to some embodiments of the present inventive concepts. FIGS. 12 to 16 illustrate cross-sectional views taken along line A-A' of FIG. 5, showing a method of fabricating a semiconductor device according to some embodiments of the present inventive concepts. For brevity of description, omission will be made to avoid duplicate explanations of components.

Figure 12:
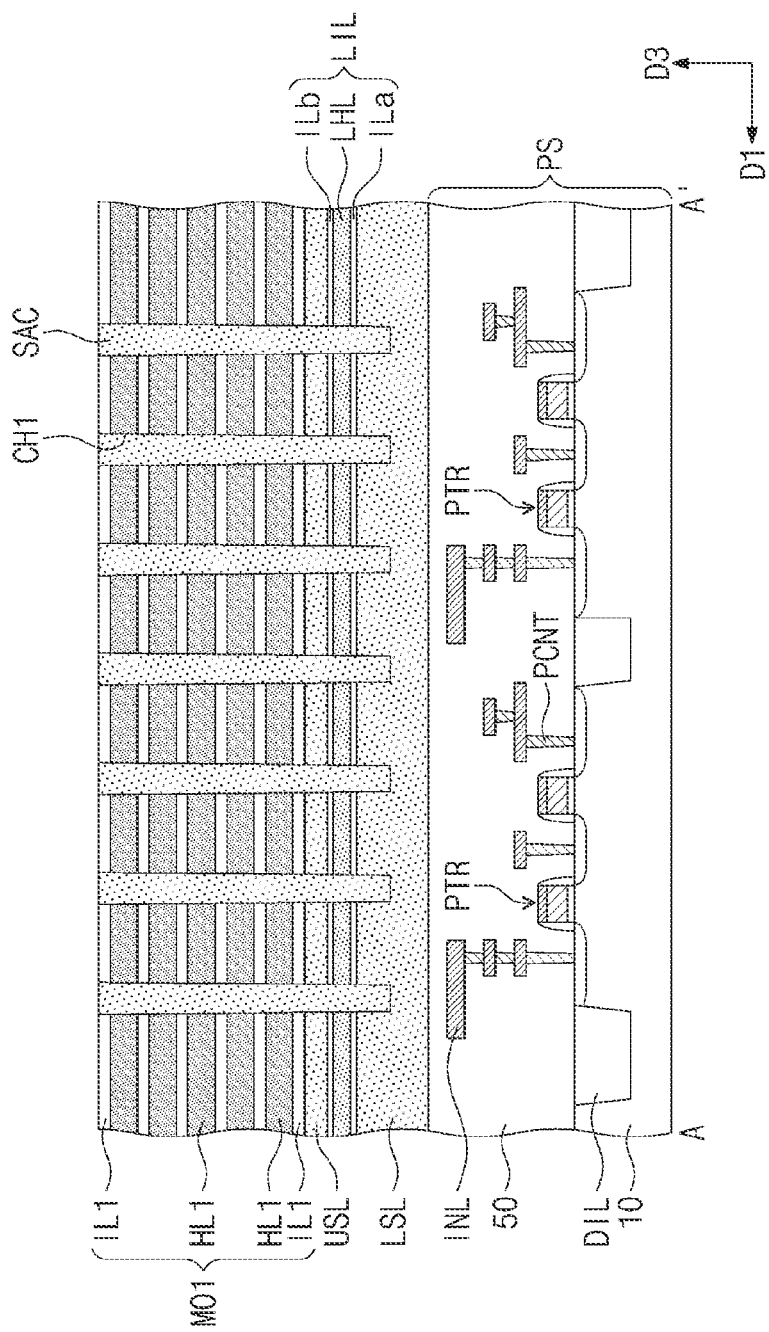
FIGS. 12 to 16 illustrate cross-sectional views taken along line A-A' of FIG. 5, showing a method of fabricating a semiconductor device according to some embodiments of the present inventive concepts.

Referring to FIGS. 11 and 12, a peripheral circuit structure PS may be formed on a first substrate 10. The formation of the peripheral circuit structure PS may include forming peripheral transistors PTR on the first substrate 10 and forming lower wiring lines INL on the peripheral transistors PTR. For example, the formation of the peripheral transistors PTR may include forming on the first substrate 10 a device isolation layer DIL that defines active regions, forming a gate dielectric layer and a gate electrode on the active regions, and implanting the active regions with impurities to form a source/drain region. A first interlayer dielectric layer 50 may be formed to cover the peripheral transistors PTR and the lower wiring lines INL.

A lower semiconductor layer LSL may be formed on the first interlayer dielectric layer 50. For example, the lower semiconductor layer LSL may include a semiconductor material, such as polysilicon. A dielectric structure LIL may be formed on the lower semiconductor layer LSL. The formation of the dielectric structure LIL may include sequentially forming a lower dielectric layer ILa, a lower sacrificial layer LHL, and an upper dielectric layer ILb on the lower semiconductor layer LSL. The lower and upper dielectric layer ILa and ILb may include a silicon oxide layer, and the lower sacrificial layer LHL may include a silicon nitride layer or a silicon oxynitride layer. An upper semiconductor layer USL may be conformally formed on the dielectric structure LIL. For example, the upper semiconductor layer USL may include a semiconductor material, such as polysilicon.

As shown in FIG. 11, a mold structure may be formed (Block S1). For example, a first mold structure MO1 may be formed on the upper semiconductor layer USL. For example, the first mold structure MO1 may be formed by alternately stacking first cell dielectric layers IL1 and first sacrificial layers HL1 on the upper semiconductor layer USL. A first dielectric layer IL1 may be provided at top of the first mold structure MO1. The first cell dielectric layer IL1 and the first sacrificial layers HL1 may be deposited by using thermal chemical vapor deposition (CVD), plasma enhanced CVD, physical CVD, or atomic layer deposition (ALD). The first cell dielectric layers IL1 may include a silicon oxide layer, and the first sacrificial layers HL1 may include a silicon nitride layer or a silicon oxynitride layer.

First channel holes CH1 may be formed to penetrate the first mold structure MO1 and the dielectric structure LIL. An anisotropic etching process may be employed to form the first channel holes CH1. The anisotropic etching process may include a plasma etching process, a reactive ion etching (RIE) process, a high-frequency inductively coupled plasma reactive ion etching (ICP-RIE) process, or an ion beam etching (IBE) process.

The first channel holes CH1 may have their lower portions formed in the lower semiconductor layer LSL. Sacrificial patterns SAC may be formed to fill the first channel holes CH1. The sacrificial patterns SAC may include a material having an etch selectivity with respect to the first cell dielectric layers IL1 and the first sacrificial layers HL1. For example, the sacrificial patterns SAC may include polycrystalline silicon. The formation of the sacrificial patterns SAC may include a planarization process, and as a result, an uppermost first cell dielectric layer IL1 may be exposed.

Figure 13:
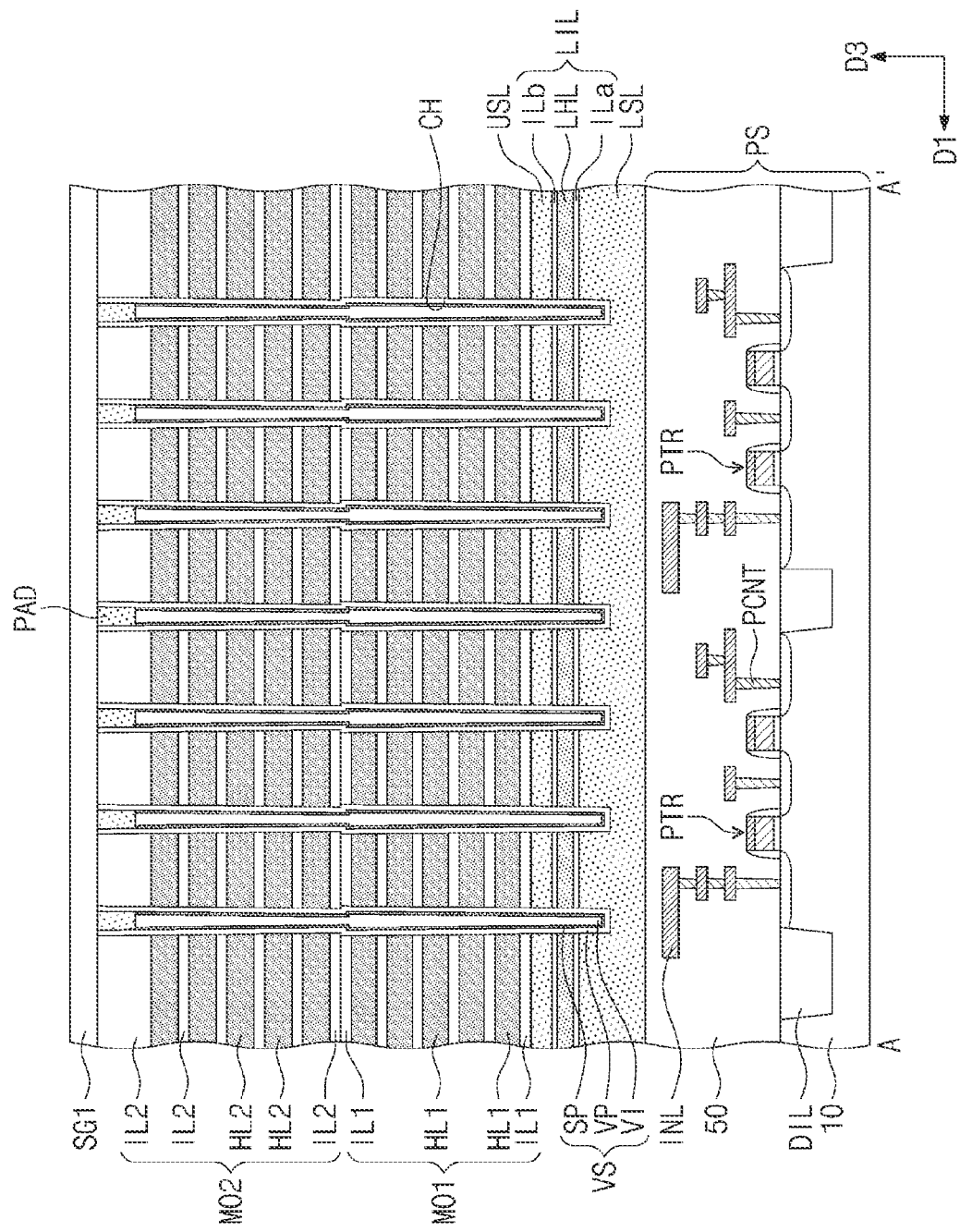

Referring to FIGS. 11 and 13, a second mold structure MO2 may be formed on the first mold structure MO1. The second mold structure MO2 may be formed by alternately depositing second cell dielectric layers IL2 and second sacrificial layers HL2. The second cell dielectric layers IL2 may include the same material as that of the first cell dielectric layers IL1. The second sacrificial layers HL2 may include the same material as that of the first sacrificial layers HL1. An uppermost second cell dielectric layer IL2 may be formed thicker than the second cell dielectric layers IL2 that underlie the uppermost second cell dielectric layer IL2.

Vertical structures VS may be formed to penetrate the second mold structure MO2 and the first mold structure MO1 (Block S2). Second channel holes may be formed to penetrate the second mold structure MO2 and to expose the sacrificial patterns SAC, and thereafter, the exposed sacrificial patterns SAC may be removed. Afterwards, the vertical structures VS may be formed to fill channel holes CH that include the first channel holes CH1 and second channel holes spatially connected to the first channel holes CH1. For example, a vertical dielectric pattern VP, a vertical semiconductor pattern SP, and a buried dielectric pattern VI may be sequentially formed in the channel holes CH, which may result in the formation of the vertical structures VS. A conductive pad PAD may be formed on an upper portion of each of the vertical structures VS. The conductive pad PAD may include one or more of an impurity-doped semiconductor material and a conductive material. The formation of the vertical structures VS may include a planarization process, and as a result, an uppermost second cell dielectric layer IL2 may be exposed. After that, a second interlayer dielectric layer SG1 may be formed to cover the vertical structures VS. The second interlayer dielectric layer SG1 may include silicon oxide.

Figure 14:
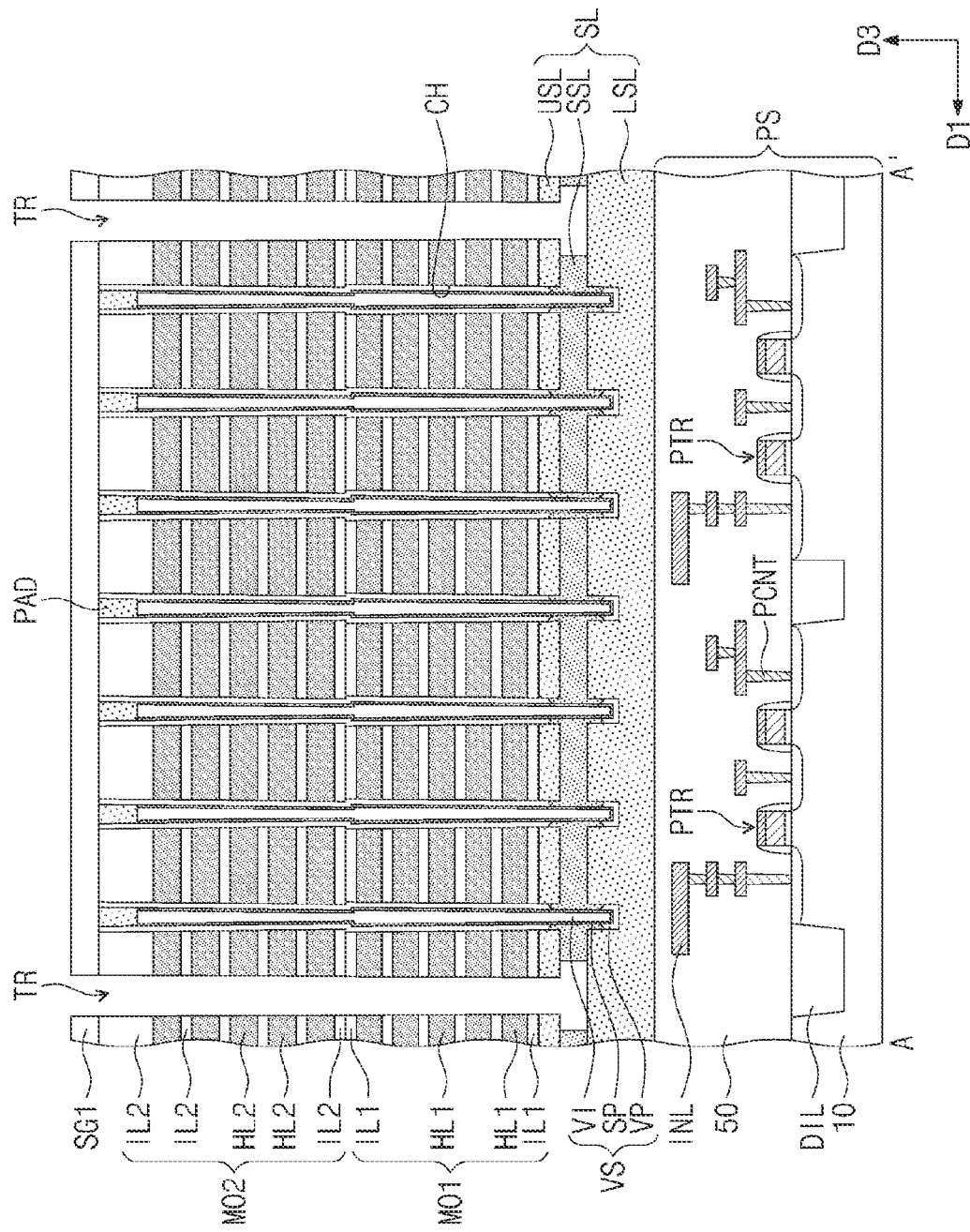

Referring to FIG. 14, trenches TR may be formed to extend in a second direction D2 and to divide the mold structures MO1 and MO2. An anisotropic etching process may be employed to form the trenches TR. The trenches TR may have respective lower portions that expose the lower sacrificial layer LHL. A source semiconductor layer SSL may replace the lower sacrificial layer LHL exposed to the trenches TR. For example, the trenches TR may be used to selectively remove the lower sacrificial layer LHL. The removal of the lower sacrificial layer LHL may expose a lower portion of the vertical dielectric pattern VP. The exposed lower portion of the vertical dielectric pattern VP may be removed to form an undercut region (e.g., the undercut region UC of FIG. 10). The undercut region UC may expose a lower portion of the vertical semiconductor pattern SP. During the removal of the lower portion of the vertical dielectric pattern VP, the lower dielectric layer ILa and the upper dielectric layer ILb may also be removed. The source semiconductor layer SSL may be formed in a space from which the dielectric structure LIL is removed. The source semiconductor layer SSL may be in contact with the vertical semiconductor pattern SP.

Figure 15:
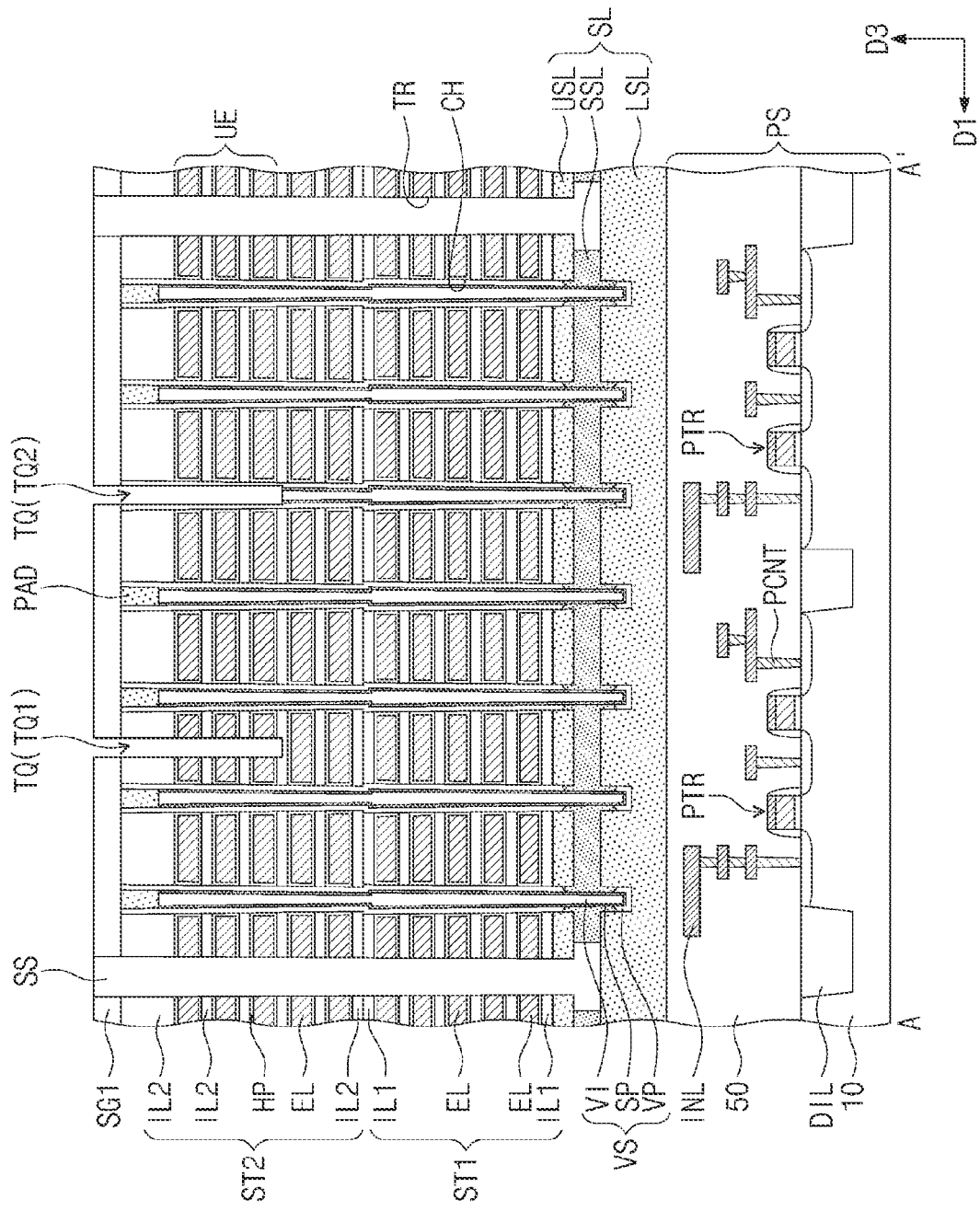

Referring to FIGS. 11 and 15, the sacrificial layers HL1 and HL2 exposed to the trenches TR may be correspondingly replaced with electrodes EL to form gate stack structures ST (Block S3). For example, the sacrificial layers HL1 and HL2 exposed to the trenches TR may be selectively removed. The electrodes EL may be correspondingly formed in spaces where the sacrificial layers HL1 and HL2 are removed. Before the electrodes EL are formed, a barrier layer HP may be formed. Afterwards, the trenches TR may be filled with a dielectric material, such as silicon oxide, and thus separation structures SS may be formed in the trenches TR. The formation of the separation structures SS may include a planarization process. Separation regions TQ may be formed to penetrate upper electrodes UE (Block S4). The separation regions TQ may include a first separation region TQ1 and a second separation region TQ2 that are disposed between a pair of separation structures SS. An anisotropic etching process may be performed to form the separation regions TQ. For example, a mask pattern may be formed on the second interlayer dielectric layer SG1, and then the mask pattern may be used as an etching mask during an etching process.

After the separation regions TQ are formed, a cleaning process may be executed. For example, a wet cleaning process may be performed to remove residues on sidewalls of the upper electrodes UE exposed to the separation regions TQ (Block S5). When the separation regions TQ are formed, metallic byproducts may be produced from the upper electrodes UE, and some of the metallic byproducts may remain in the separation regions TQ. For example, the metallic byproducts may include metal oxide, such as tungsten oxide. The wet cleaning process may use a wet cleaning solution, such as hydrochloric acid, to remove the metal oxide mentioned above. The wet cleaning process may form recesses R1 to R3 discussed with reference to FIGS. 8 and 9.

A gas phase cleaning process may be performed to additionally remove, from the separation regions TQ, residues that are not completely removed by the wet cleaning process (Block S6). The gas phase cleaning process may use a chlorine-containing gas, for example, at least one selected from chlorine gas ($Cl_2$), dichlorosilane (DCS), hexachlorodisilane (HCD), and trichlorosilane (TCS). The gas phase cleaning process may further include performing an annealing step under conditions of a chlorine- or fluorine-containing gas, for example, at least one selected from hydrofluoric acid (HF), silicon tetrachloride ($SiCl_4$), HCD ($Si_2Cl_6$), aluminum chloride ($AlCl_3$), and silicon tetrafluoride (SiF4).

The gas phase cleaning process may be executed at temperatures of about 300° C. to about 500° C. The chlorine used in the gas phase cleaning process may partially remain on exposed surfaces of the upper electrodes UE and/or exposed surfaces of the second cell dielectric layers IL2, but the present inventive concepts are not limited thereto.

Figure 16:
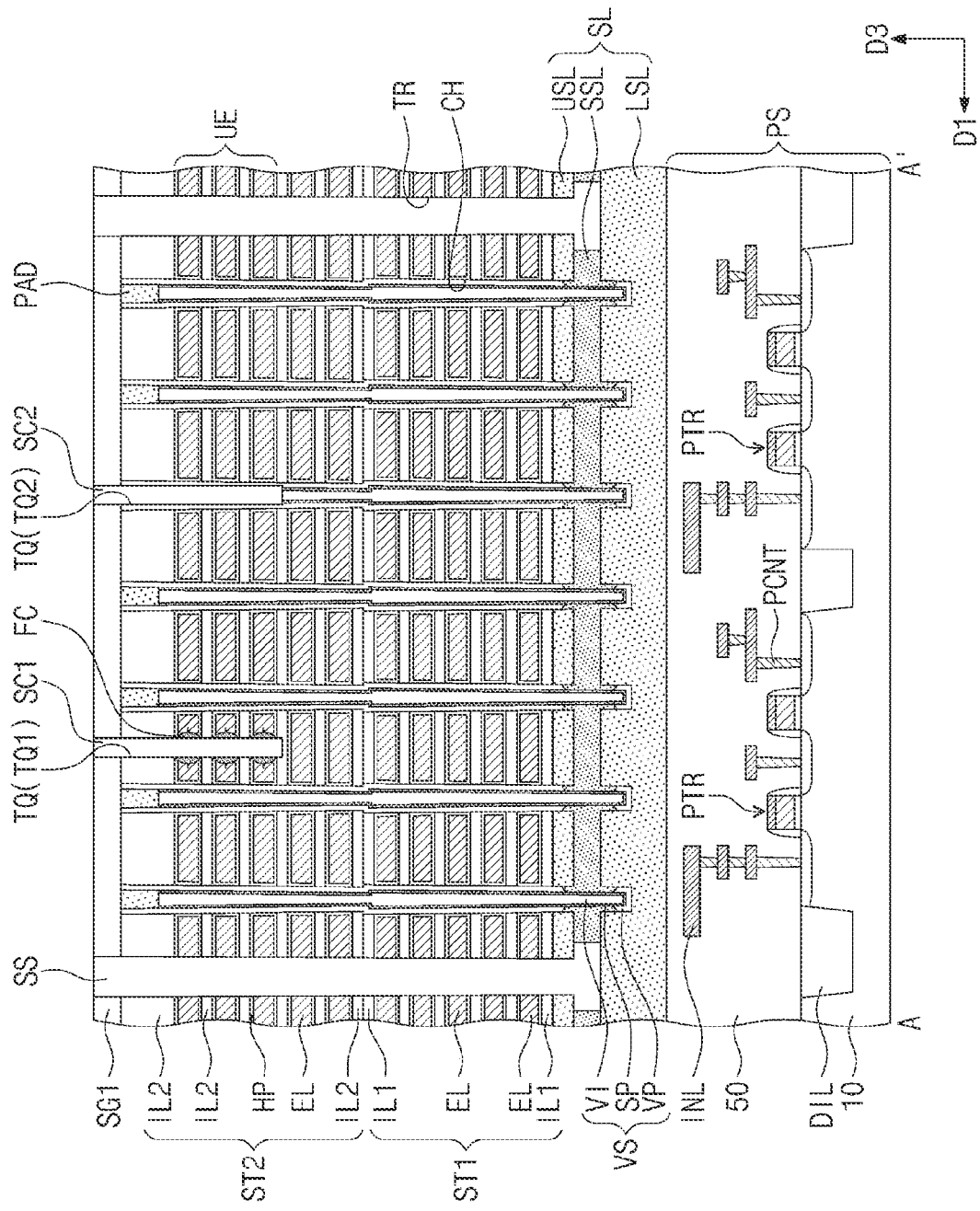

Referring to FIGS. 11 and 16, a selective deposition process may be performed to form capping patterns FC that are on (e.g., that cover) exposed sidewalls of the upper electrodes UE (Block S7). The capping patterns FC may not be formed on the second cell dielectric layers IL2, and may be grown from the sidewalls of the upper electrodes UE. Accordingly, the capping patterns FC may not cover (e.g., not fully cover) any sidewalls of the second cell dielectric layers IL2. The capping patterns FC may include either a conductive material, such as polycrystalline silicon, metal, and metal nitride, or a dielectric material, such as silicon nitride. For example, the selective deposition process may be performed in which at least one selected from diisopropylaminosilane (DIPAS), monosilane (MS), and disilane (DS) is used as a source gas. The selective deposition process and the gas phase cleaning process discussed in FIG. 15 may be in-situ performed in the same process chamber. The gas phase cleaning process and the selective deposition process may be executed under vacuum state in a process chamber. For example, the gas phase cleaning process and the selective deposition process may be performed in a process chamber different from that in which the wet cleaning process is performed. For example, the gas phase cleaning process and the selective deposition process may be performed in a chamber of chemical vapor deposition facility. The selective deposition process may cause the upper electrodes UE and/or the second cell dielectric layers IL2 to have on their exposed surfaces a carbon (and/or nitrogen) concentration greater than that on other portions.

According to some embodiments, it may be possible to completely remove conductive byproducts capable of remaining even after the wet cleaning process is performed. Moreover, because capping patterns are formed in the same process chamber after the gas phase cleaning process, upper electrodes may be protected/prevented from being additionally contaminated due to natural oxidation on exposed surfaces of the upper electrodes, with the result that it may be possible to reduce process defects and to improve operating characteristics such as leakage current, which may increase due to contamination. Furthermore, because separation dielectric patterns are formed after the formation of electrodes, an electrode material may completely replace the first sacrificial layers HL1 in areas between a plurality of separation regions. Separation dielectric patterns SC1 and SC2 may be formed to fill the separation regions TQ (Block S8). The formation of the separation dielectric patterns SC1 and SC2 may include performing a planarization process after depositing a dielectric layer such as a silicon oxide layer.

Referring back to FIGS. 5 and 6, first contact plugs CT1 may be formed to penetrate the second interlayer dielectric layer SG1 and to have coupling to corresponding conductive pads PAD. A third interlayer dielectric layer SG2 may be formed on the second interlayer dielectric layer SG1, and second contact plugs CT2 may be formed to penetrate the third interlayer dielectric layer SG2. After that, bit lines BL may be formed on the third interlayer dielectric layer SG2. Accordingly, a cell array structure CS may be eventually formed.

Figure 17:
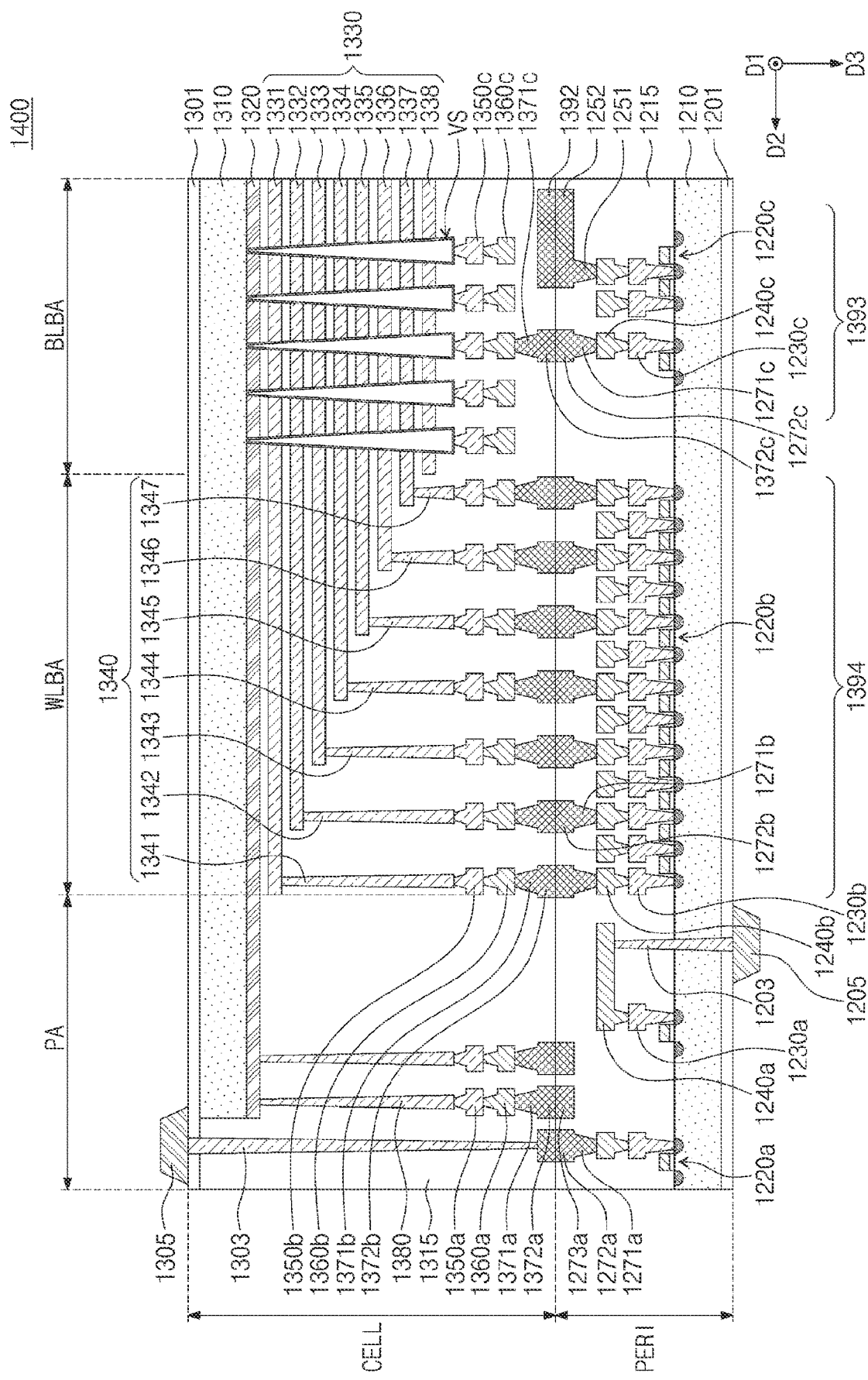
FIG. 17 illustrates a cross-sectional view showing a semiconductor device according to some embodiments of the present inventive concepts.

FIG. 17 illustrates a cross-sectional view showing a semiconductor device according to some embodiments of the present inventive concepts.

Referring to FIG. 17, a memory device 1400 may have a chip-to-chip (C2C) structure. The C2C structure may be fabricated by forming on a first wafer an upper chip including a cell array structure CELL; forming, on a second wafer different from the first wafer, a lower chip including a peripheral circuit structure PERI; and then using a bonding method to connect the upper and lower chips to each other. For example, the bonding method may include electrically connecting a bonding metal formed on an uppermost metal layer of the upper chip to a bonding metal formed on an uppermost metal layer of the lower chip. For example, when the bonding metal is formed of copper (Cu), the bonding method may be a Cu-to-Cu bonding method, and the bonding metal may also be formed of aluminum or tungsten.

Each of the peripheral circuit structure PERI and the cell array structure CELL of the memory device 1400 may include an outer pad bonding region PA, a word-line bonding region WLBA, and a bit-line bonding region BLBA.

The peripheral circuit structure PERI may include a first substrate 1210, an interlayer dielectric layer 1215, a plurality of circuit elements 1220a, 1220b, and 1220c formed on the first substrate 1210, first metal layers 1230a, 1230b, and 1230c respectively connected to the plurality of circuits elements 1220a, 1220b, and 1220c, and second metal layers 1240a, 1240b, and 1240c respectively formed on the first metal layers 1230a, 1230b, and 1230c. In some embodiments, the first metal layers 1230a, 1230b, and 1230c may be formed of tungsten whose electrical resistivity is relatively high, and the second metal layers 1240a, 1240b, and 1240c may be formed of copper whose electrical resistivity is relatively low.

The first metal layers 1230a, 1230b, and 1230c and the second metal layers 1240a, 1240b, and 1240c are illustrated and explained in this description, but the present inventive concepts are not limited thereto, and one or more metal layers may further be formed on the second metal layers 1240a, 1240b, and 1240c. At least one of the metal layers formed on the second metal layers 1240a, 1240b, and 1240c may be formed of aluminum whose electrical resistivity is less than that of copper used for forming the second metal layers 1240a, 1240b, and 1240c.

The interlayer dielectric layer 1215 may be disposed on the first substrate 1210 so as to cover the plurality of circuit elements 1220a, 1220b, and 1220c, the first metal layers 1230a, 1230b, and 1230c, and the second metal layers 1240a, 1240b, and 1240c, and may include a dielectric material, such as silicon oxide or silicon nitride.

A lower bonding metal 1271b and 1272b may be formed on the second metal layer 1240b of the word-line bonding region WLBA. The word-line bonding region WLBA may correspond to the connection region CNR discussed with reference to FIG. 5. On the word-line bonding region WLBA, the lower bonding metal 1271b and 1272b of the peripheral circuit structure PERI may be bonded to and electrically connected to an upper bonding metal 1371b and 1372b of the cell array structure CELL, and the lower bonding metal 1271b and 1272b and the upper bonding metal 1371b and 1372b may be formed of aluminum, copper, or tungsten.

The cell array structure CELL may provide at least one memory block. The cell array structure CELL may include a second substrate 1310 and a common source line 1320. The second substrate 1310 may be provided thereon with a plurality of electrodes 1331 to 1338 (or 1330) that are stacked along a direction perpendicular to a top surface of the second substrate 1310. On the bit-line bonding region BLBA, a vertical structure VS may penetrate the plurality of electrodes 1330, while extending in the direction perpendicular to the top surface of the second substrate 1310. The vertical structure VS may include a data storage layer, a channel layer, and a buried dielectric layer, and the channel layer may be electrically connected to a first metal layer 1350c and a second metal layer 1360c. For example, the first metal layer 1350c may be a bit-line contact, and the second metal layer 1360c may be a bit line.

The bit-line bonding region BLBA may be defined to refer to an area where the vertical structure VS and the bit line 1360c are disposed, and may correspond to the cell array region CAR discussed with reference to FIG. 5. The bit line 1360c may be electrically connected to the circuit element 1220c that provides a page buffer 1393 on the peripheral circuit structure PERI adjacent to the bit-line bonding region BLBA. For example, the bit line 1360c may have connection through an upper bonding metal 1371c and 1372c with the peripheral circuit structure PERI, and the upper bonding metal 1371c and 1372c may have connection with a lower bonding metal 1271c and 1272c connected to the circuit elements 1220c of the page buffer 1393.

On the word-line bonding region WLBA, the electrodes 1330 may extend along the second direction D2 parallel to the top surface of the second substrate 1310, and may be connect to the plurality of cell contact plugs 1341 to 1347 (or 1340). Ones of the electrodes 1330 may extend along the second direction D2 to have their lengths different from each other, and may have pads at which the electrodes 1330 are connected to the cell contact plugs 1340. The first metal layer 1350b and the second metal layer 1360c may be sequentially connected to upper portions of the cell contact plugs 1340 connected to the electrodes 1330. On the word-line bonding region WLBA, the cell contact plugs 1340 may be connected to the peripheral circuit structure PERI through the upper bonding metal 1371b and 1372b and the lower bonding metal 1271b and 1272b of the peripheral circuit structure PERI.

The cell contact plugs 1340 may be electrically connected to the circuit elements 1220b that form a row decoder 1394 on the peripheral circuit structure PERI. In some embodiments, an operating voltage of the circuit elements 1220b that form the row decoder 1394 may be different from that of the circuit elements 1220c that form the page buffer 1393. For example, the operating voltage of the circuit elements 1220b that form the row decoder 1394 may be greater than that of the circuit elements 1220c that form the page buffer 1393.

A common source line contact plug 1380 may be disposed on the outer pad bonding region PA. The common source line contact plug 1380 may be formed of a conductive material, such as metal, metal compound, or polysilicon, and may be electrically connected to the common source line 1320. The first metal layer 1350a and the second metal layer 1360a may be sequentially stacked on an upper portion of the common source line contact plug 1380. For example, the outer pad bonding region PA may be defined to refer to an area on which are disposed the common source line contact plug 1380, the first metal layer 1350a, and the second metal layer 1360a.

Input/output pads 1205 and 1305 may be disposed on the outer pad bonding region PA. A lower dielectric layer 1201 may be formed below the first substrate 1210, covering a bottom surface of the first substrate 1210, and a first input/output pad 1205 may be formed on the lower dielectric layer 1201. The first input/output pad 1205 may be connected through the first input/output contact plug 1203 to at least one of the plurality of circuit elements 1220a, 1220b, and 1220c disposed on the peripheral circuit structure PERI, and may be separated by the lower dielectric layer 1201 from the first substrate 1210. In addition, a sidewall dielectric layer may be disposed between and electrically separate the first input/output contact plug 1203 and the first substrate 1210 from each other.

An upper dielectric layer 1301 may be formed on the second substrate 1310, covering a top surface of the upper dielectric layer 1301, and a second input/output pad 1305 may be disposed on the upper dielectric layer 1301. The second input/output pad 1305 may be connected through a second input/output contact plug 1303 to at least one of the plurality of circuit elements 1220a, 1220b, and 1220c disposed on the peripheral circuit structure PERI. For example, the second input/output pad 1305 may be electrically connected to the circuit element 1220a.

In some embodiments, neither the second substrate 1310 nor the common source line 1320 may be disposed on an area where the second input/out contact plug 1303 is placed. In addition, the second input/output pad 1305 may not overlap in the third direction D3 with the electrodes 1330. The second input/output contact plug 1303 may be spaced apart from the second substrate 1310 in the second direction D2, and may penetrate an interlayer dielectric layer 1315 of the cell array structure CELL to come into connection (e.g., contact) with the second input/output pad 1305.

In some embodiments, the first input/output pad 1205 and the second input/output pad 1305 may be selectively formed. For example, the memory device 1400 may include only the first input/output pad 1205 disposed on an upper (or lower) portion of the first substrate 1210, or only the second input/output pad 1305 disposed on an upper (or lower) portion of the second substrate 1310. For another example, the memory device 1400 may include each of the first input/output pad 1205 and the second input/output pad 1305.

On each of the outer pad bonding region PA and the bit-line bonding region BLBA that are included in each of the cell array structure CELL and the peripheral circuit structure PERI, a metal pattern at an uppermost metal layer may be present as a dummy pattern, or the uppermost metal layer may be absent.

On the outer pad bonding region PA, the memory device 1400 may include a lower metal pattern 1273a formed at an uppermost metal layer of the peripheral circuit structure PERI, which lower metal pattern 1273a may correspond to and have the same shape as that of an upper metal pattern 1372a formed at an uppermost metal layer of the cell array structures CELL. The lower metal pattern 1273a formed at the uppermost metal layer of the peripheral circuit structure PERI may not be connected to a separate contact on the peripheral circuit structure PERI. Similarly, on the outer pad bonding region PA, an upper metal pattern 1371a may be formed at an upper metal layer of the cell array structure CELL, which upper metal pattern 1371a may correspond to and have the same shape as that of a lower metal pattern 1272a formed at an upper metal layer of the peripheral circuit structure PERI. A metal pattern 1271a may electrically connect the lower metal pattern 1272a and the second metal layer 1240a.

A lower bonding metal 1271b and 1272b may be formed on the second metal layer 1240b of the word-line bonding region WLBA. On the word-line bonding region WLBA, the lower bonding metal 1271b and 1272b of the peripheral circuit structure PERI may be bonded to and electrically connected to the upper bonding metal 1371b and 1372b of the cell array structure CELL.

Moreover, on the bit-line bonding region BLBA, an upper metal pattern 1392 may be formed at an uppermost metal layer of the cell array structure CELL, which upper metal pattern 1392 may correspond to and have the same shape as that of a lower metal pattern 1252 formed at an uppermost metal layer of the peripheral circuit structure PERI. No contact may be formed on the upper metal pattern 1392 formed at the uppermost metal layer of the cell array structure CELL. Moreover, a metal pattern 1251 may electrically connect the lower metal pattern 1252 and the second metal layer 1240c.

According to some embodiments of the present inventive concepts, it may be possible to completely remove conductive byproducts capable of being generated during the formation of a separation region and to impede/prevent contamination capable of being produced before the formation of separation patterns to fill the separation region. Accordingly, it may then be possible to reduce process defects and to improve operating characteristics such as leakage current, which may increase due to contamination.

Although the present inventive concepts have been described in connection with some embodiments of the present inventive concepts illustrated in the accompanying drawings, it will be understood by those skilled in the art that various changes, substitutions, and modifications may be made without departing from the scope of the present inventive concepts.

What is claimed is:

1. A semiconductor device comprising:
   a plurality of gate stack structures on a substrate;
   a plurality of separation structures that extend in a first direction on the substrate and separate the gate stack structures from each other; and
   a plurality of vertical structures that penetrate the gate stack structures,
   wherein each of the gate stack structures includes:
      a plurality of electrodes and a plurality of cell dielectric layers that are alternately stacked, the electrodes including a plurality of upper electrodes;
      a barrier layer that extends between the electrodes and the cell dielectric layers;
      a separation dielectric pattern that extends in the first direction, the separation dielectric pattern penetrating the upper electrodes to separate each of the upper electrodes into pieces that are spaced apart from each other in a second direction that intersects the first direction; and
      a plurality of capping patterns between the separation dielectric pattern and the upper electrodes,
   wherein the capping patterns are on sidewalls of each of the upper electrodes,
   wherein each of the capping patterns is on a sidewall of the barrier layer, and
   wherein each of the capping patterns extends in a third direction perpendicular to a top surface of the substrate to cover the sidewall of the barrier layer and is spaced apart from other ones of the capping patterns in the third direction.

2. The semiconductor device of claim 1,
   wherein the capping patterns have mirror symmetry about the separation dielectric pattern, and
   wherein the capping patterns do not cover any sidewalls of the cell dielectric layers.

3. The semiconductor device of claim 1,
   wherein the separation dielectric pattern comprises a first separation dielectric pattern, and
   wherein each of the gate stack structures further includes a second separation dielectric pattern.

4. The semiconductor device of claim 1, wherein the capping patterns are conductors.

5. The semiconductor device of claim 4, wherein the conductors include polycrystalline silicon.

6. The semiconductor device of claim 1, wherein each of the capping patterns includes:
   a first part that covers the sidewall of one of the upper electrodes; and
   a second part that vertically extends from the first part and covers the sidewall of the barrier layer.

7. The semiconductor device of claim 6, wherein a first thickness of the first part in the second direction is greater than a second thickness of the second part in the second direction.

8. The semiconductor device of claim 6, wherein each of the capping patterns further includes a third part that protrudes from the first part into the one of the upper electrodes.

9. The semiconductor device of claim 1,
   wherein each of the capping patterns includes a first sidewall in contact with one of the upper electrodes and a second sidewall in contact with the separation dielectric pattern,
   wherein the first sidewall has a convex shape in a direction away from the separation dielectric pattern.

10. The semiconductor device of claim 9, wherein the second sidewall has a convex shape in a direction toward the separation dielectric pattern.

11. The semiconductor device of claim 9, wherein the second sidewall has a convex shape in a direction away from the separation dielectric pattern.

12. The semiconductor device of claim 1, wherein the capping patterns are spaced apart from each other in the first direction and the second direction.

13. The semiconductor device of claim 12,
   wherein the vertical structures include a plurality of dummy vertical structures that are overlapped by the separation dielectric pattern, and
   wherein the capping patterns and the dummy vertical structures alternate with each other along the first direction.

14. A semiconductor device comprising:
   a plurality of gate stack structures on a substrate;
   a plurality of separation structures that extend in a first direction on the substrate and separate the gate stack structures from each other; and
   a plurality of vertical structures that penetrate the gate stack structures,
   wherein each of the gate stack structures includes:
      a plurality of electrodes and a plurality of cell dielectric layers that are alternately stacked, the electrodes including a plurality of upper electrodes;
      a separation dielectric pattern that extends in the first direction, the separation dielectric pattern penetrating the upper electrodes to separate each of the upper electrodes into pieces that are spaced apart from each other in a second direction that intersects the first direction; and
      a plurality of capping patterns between the separation dielectric pattern and the upper electrodes, and
   wherein ones of the capping patterns that are commonly in contact with the same one of the upper electrodes are spaced apart from each other along the first direction.

15. The semiconductor device of claim 14,
   wherein the separation dielectric pattern comprises a first separation dielectric pattern, and
   wherein each of the gate stack structures further includes a second separation dielectric pattern.

16. The semiconductor device of claim 14, wherein the capping patterns are on sidewalls of each of the upper electrodes and are spaced apart from each other in a third direction perpendicular to a top surface of the substrate.

17. The semiconductor device of claim 14,
wherein each of the capping patterns includes a first sidewall in contact with one of the upper electrodes and a second sidewall in contact with the separation dielectric pattern, and
wherein the first sidewall has a convex shape in a direction away from the separation dielectric pattern.

18. The semiconductor device of claim 17, wherein the second sidewall has a convex shape in a direction toward the separation dielectric pattern.

19. An electronic system comprising:
a main board;
a semiconductor device on the main board; and
a controller on the main board and electrically connected to the semiconductor device,
wherein the semiconductor device includes:
a substrate;
a plurality of gate stack structures on the substrate;
a plurality of separation structures that extend in a first direction on the substrate and separate the gate stack structures from each other; and
a plurality of vertical structures that penetrate the gate stack structures,
wherein each of the gate stack structures includes:
a plurality of electrodes and a plurality of cell dielectric layers that are alternately stacked, the electrodes including a plurality of upper electrodes;
a barrier layer that extends between the electrodes and the cell dielectric layers;
a separation dielectric pattern that extends in the first direction, the separation dielectric pattern penetrating the upper electrodes to separate each of the upper electrodes into pieces that are spaced apart from each other in a second direction that intersects the first direction; and
a plurality of capping patterns between the separation dielectric pattern and the upper electrodes,
wherein the capping patterns are on sidewalls of each of the upper electrodes,
wherein each of the capping patterns is on a sidewall of the barrier layer, and
wherein each of the capping patterns extends in a third direction perpendicular to a top surface of the substrate to cover the sidewall of the barrier layer and is spaced apart from other ones of the capping patterns in the third direction.

20. The electronic system of claim 19,
wherein the vertical structures include a plurality of dummy vertical structures that are spaced apart from each other in the first direction,
wherein the separation dielectric pattern extends continuously in the first direction to overlap each of the dummy vertical structures, and
wherein the capping patterns and the dummy vertical structures alternate with each other along the first direction.

* * * * *